US012710700B2

(12) United States Patent
Morikuni et al.

(10) Patent No.: US 12,710,700 B2
(45) Date of Patent: Aug. 18, 2026

(54) SUBSTRATE HOLDING APPARATUS, SUBSTRATE PROCESSING APPARATUS, SEPARATION METHOD, AND ARTICLE MANUFACTURING METHOD

(71) Applicant: CANON KABUSHIKI KAISHA, Tokyo (JP)

(72) Inventors: Yuichiro Morikuni, Tochigi (JP); Shigeo Koya, Tochigi (JP); Kazunori Nakajima, Tokyo (JP); Hikari Watanabe, Tochigi (JP); Daisuke Ogawa, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 29 days.

(21) Appl. No.: 18/887,325

(22) Filed: Sep. 17, 2024

(65) Prior Publication Data

US 2025/0093788 A1 Mar. 20, 2025

(30) Foreign Application Priority Data

Sep. 19, 2023 (JP) ................................ 2023-151544
Jun. 3, 2024 (JP) ................................ 2024-090286

(51) Int. Cl.
*H10P 72/78* (2026.01)
*G03F 7/00* (2006.01)
*G03F 7/20* (2006.01)

(52) U.S. Cl.
CPC .......... *G03F 7/707* (2013.01); *G03F 7/70758* (2013.01); *G03F 7/70783* (2013.01);
(Continued)

(58) Field of Classification Search
CPC .. G03F 7/707; G03F 7/70758; G03F 7/70783; G03F 7/7085; G03F 7/70866;
(Continued)

(56) References Cited

U.S. PATENT DOCUMENTS 5,191,218 A * 3/1993 Mori ....................... G03F 7/707 269/21
6,590,633 B1 7/2003 Nishi et al.
(Continued)

FOREIGN PATENT DOCUMENTS

CN 101174548 A 5/2008
CN 115319787 A 11/2022
(Continued)

OTHER PUBLICATIONS

Extended European search report issued in European Appln. No. 24200177.4 mailed on Apr. 17, 2025.
(Continued)

*Primary Examiner* — Steven H Whitesell
(74) *Attorney, Agent, or Firm* — ROSSI, KIMMS & McDOWELL LLP

(57) ABSTRACT

A substrate holding apparatus includes a holder configured to hold a substrate, and a gas supplier configured to supply a gas between the substrate and the holder, wherein when separating the substrate from the holder holding the substrate, the gas supplier supplies the gas based on information concerning an adhesive force between the substrate and the holder.

16 Claims, 13 Drawing Sheets

(52) U.S. Cl.
CPC ........ *G03F 7/7085* (2013.01); *G03F 7/70866* (2013.01); *H10P 72/78* (2026.01)

(58) Field of Classification Search
CPC . G03F 7/20; H01L 21/6838; H01L 21/68742; H01L 21/67288; H01L 21/67017; H01L 21/67253; H01L 21/67259; H01L 21/68785; H01L 2223/54493; H10P 72/72; H10P 72/722; H10P 72/78; H10P 72/0616; H10P 72/7624
See application file for complete search history.

(56) References Cited

U.S. PATENT DOCUMENTS

| | | | | |
|---|---|---|---|---|
| 11,664,264 | B2 | 5/2023 | Jeunink et al. | |
| 2002/0130276 | A1* | 9/2002 | Sogard | G03F 7/70708 257/E23.099 |
| 2004/0182311 | A1* | 9/2004 | Hanazaki | H01L 21/67288 118/663 |
| 2005/0128463 | A1* | 6/2005 | Ottens | G03F 7/70708 355/75 |
| 2007/0118246 | A1* | 5/2007 | Suzuki | H01L 21/6838 118/724 |
| 2010/0254063 | A1* | 10/2010 | Sheng | H01L 21/6833 118/723 R |
| 2011/0207291 | A1* | 8/2011 | Tsuno | H01L 21/187 438/455 |
| 2011/0228439 | A1* | 9/2011 | Kobayashi | H01L 21/67109 361/234 |
| 2012/0301832 | A1 | 11/2012 | Tsuruda | |
| 2019/0043749 | A1* | 2/2019 | Jeunink | H01L 21/68742 |
| 2019/0287842 | A1* | 9/2019 | Yasunobe | G03F 7/707 |
| 2020/0091092 | A1 | 3/2020 | Ito et al. | |
| 2023/0082322 | A1 | 3/2023 | Senshu | |
| 2023/0110011 | A1 | 4/2023 | Sumi et al. | |

FOREIGN PATENT DOCUMENTS

| | | | |
|---|---|---|---|
| EP | 3223073 | A2 | 9/2017 |
| JP | 2004063528 | A | 2/2004 |
| JP | 2008251749 | A | 10/2008 |
| JP | 2019505841 | A | 2/2019 |
| JP | 2019083286 | A | 5/2019 |
| KR | 1020020073273 | A | 9/2002 |
| KR | 1020050060006 | A | 6/2005 |
| KR | 1020130038199 | A | 4/2013 |
| KR | 1020230045548 | A | 4/2023 |
| TW | 202015164 | A | 4/2020 |
| TW | 202205347 | A | 2/2022 |
| WO | 2017137129 | A1 | 8/2017 |

OTHER PUBLICATIONS

Office Action issued in Taiwanese Appln. No. 113134634 dated Nov. 27, 2025.

First Office Action issued in Chinese Appln. No. 202411303238.1 mailed Apr. 29, 2026.

Office Action issued in Taiwanese Application No. 115122777 dated Jun. 26, 2026.

* cited by examiner

F I G. 2
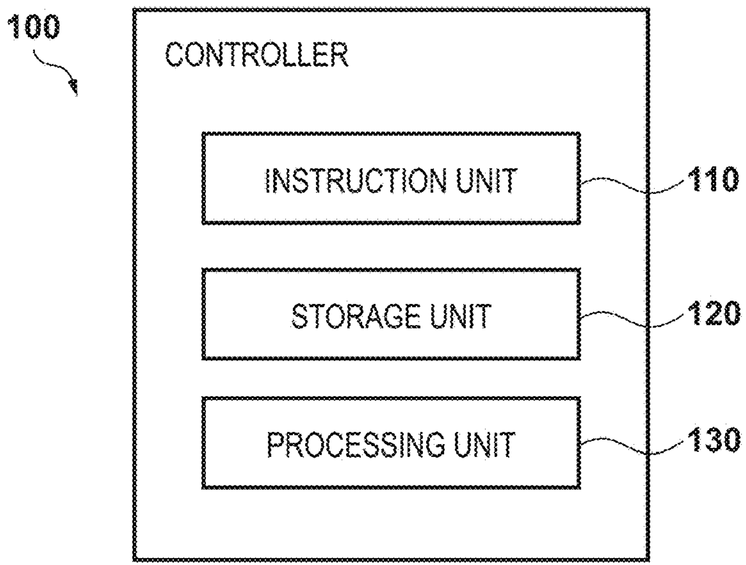
F I G. 3
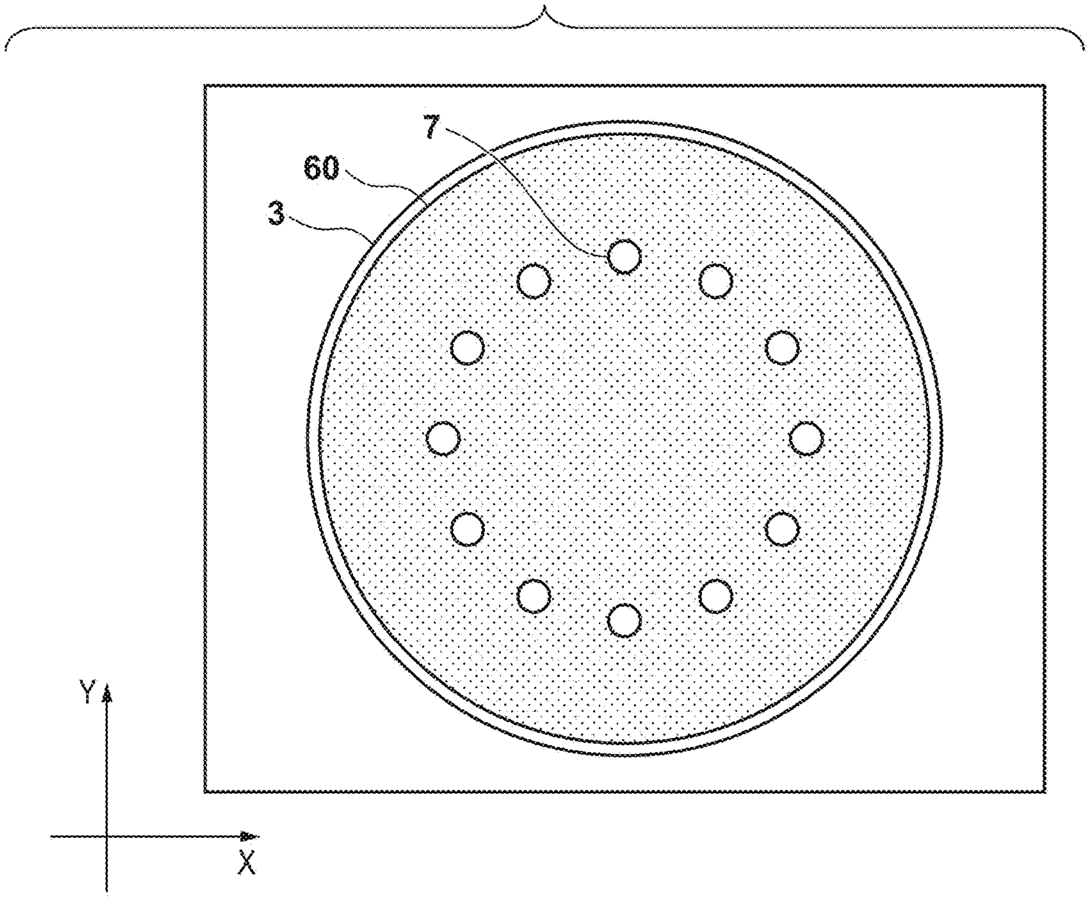

GAS SUPPLY
FLOW RATE
[L/min]
WHEN SOLENOID VALVE 51 IS ON
WHEN SOLENOID VALVE 52 IS ON
WHEN SOLENOID VALVE 53 IS ON
TIME [msec]

ADHESIVE
FORCE
[N]
OPTIMAL POINT
TIME [msec]

GAS SUPPLY
FLOW RATE
[L/min]
WHEN SOLENOID VALVE 51 IS ON
WHEN SOLENOID VALVE 52 IS ON
WHEN SOLENOID VALVE 53 IS ON
TIME [msec]

ADHESIVE
FORCE
[N]
OPTIMAL POINT
TIME [msec]

1
2
3
8
100
13
11
10
20
21
31
41
32
42
51
61
52
62
53
63
54
64
55
65
56
66
5
6
X
Y
Z

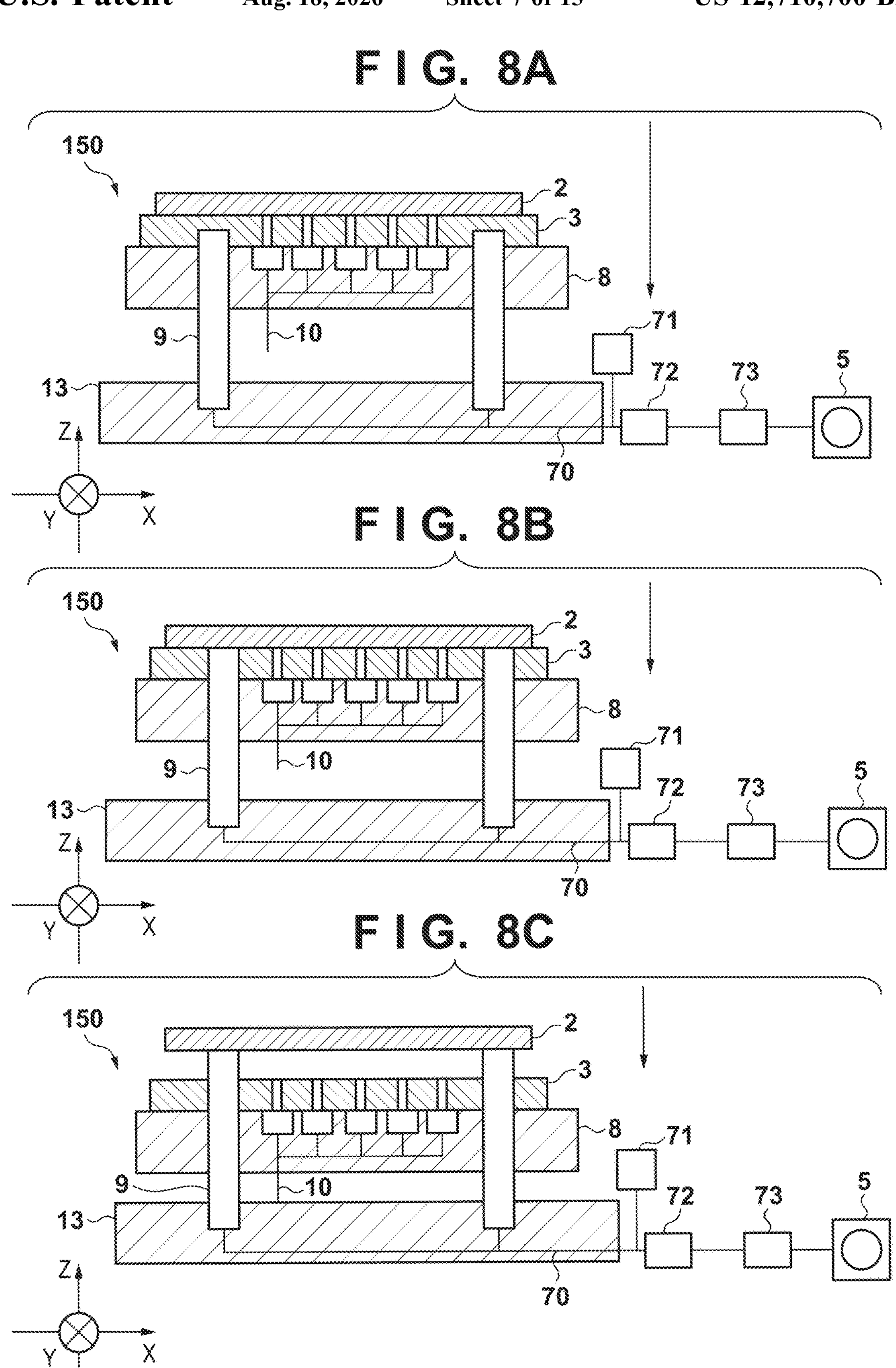
F I G. 8A
150
2
3
8
71
9
10
13
72
73
5
Z
70
Y
X
F I G. 8B
150
2
3
8
71
9
10
13
72
73
5
Z
70
Y
X
F I G. 8C
150
2
3
8
71
9
10
13
72
73
5
70
Z
Y
X Z DIRECTION POSITION
FIRST POSITION
TIME
FIRST SECTION
SECOND SECTION
THIRD SECTION
FOURTH SECTION
FIFTH SECTION 200
202
203
204
206
207
208
209
100
1
2
3
8
9
13
214
215
216
217
218
210
211
212
213
219
220
221
X
Y
Z

SUBSTRATE HOLDING APPARATUS, SUBSTRATE PROCESSING APPARATUS, SEPARATION METHOD, AND ARTICLE MANUFACTURING METHOD

BACKGROUND OF THE INVENTION

Field of the Invention

The present invention relates to a substrate holding apparatus, a substrate processing apparatus, a separation method, and an article manufacturing method.

Description of the Related Art

A substrate processing apparatus used in a manufacturing process of a semiconductor device, a liquid crystal display device, or the like can include a substrate chuck (substrate holder) for holding a substrate. The smoothness of holding and releasing the substrate by the substrate chuck is related not only to the productivity but also to the wear resistance of each of the substrate and the substrate chuck.

Japanese Patent Laid-Open No. 2019-505841 describes that, when unloading a substrate from a support table, a gas is supplied into a gap between the base surface of the support table and the substrate via gas flow openings formed in the support table.

In a case where the substrate chuck chucks a substrate, even after the chucking is released, an adhesive force acts between the substrate and the substrate chuck. When separating the substrate from the substrate chuck, if the supply amount of the gas is excessively large with respect to the adhesive force, the substrate floats from the substrate chuck and the substrate slides laterally. On the other hand, when separating the substrate from the substrate chuck, if the supply amount of the gas is excessively small with respect to the adhesive force, the substrate is not separated from the substrate chuck, thereby causing the substrate chuck to wear. Since the adhesive force depends on the characteristics of the substrate and the characteristics of the substrate chuck, it is preferable that the gas supply for separating the substrate from the substrate chuck is appropriately set each time in accordance with the adhesive force.

SUMMARY OF THE INVENTION

The present invention provides a technique advantageous in suppressing wear of each of a substrate and a holder that holds the substrate.

The present invention in its one aspect provides a substrate holding apparatus including a holder configured to hold a substrate, and a gas supplier configured to supply a gas between the substrate and the holder, wherein when separating the substrate from the holder holding the substrate, the gas supplier supplies the gas based on information concerning an adhesive force between the substrate and the holder.

Further features of the present invention will become apparent from the following description of exemplary embodiments (with reference to the attached drawings).

BRIEF DESCRIPTION OF THE DRAWINGS

FIG. 2 is a view showing the functional arrangement of a controller;

FIG. 3 is a plan view of a substrate chuck;

FIGS. 8A to 8C are views for explaining a substrate transfer operation;

DESCRIPTION OF THE EMBODIMENTS

Figure 1:
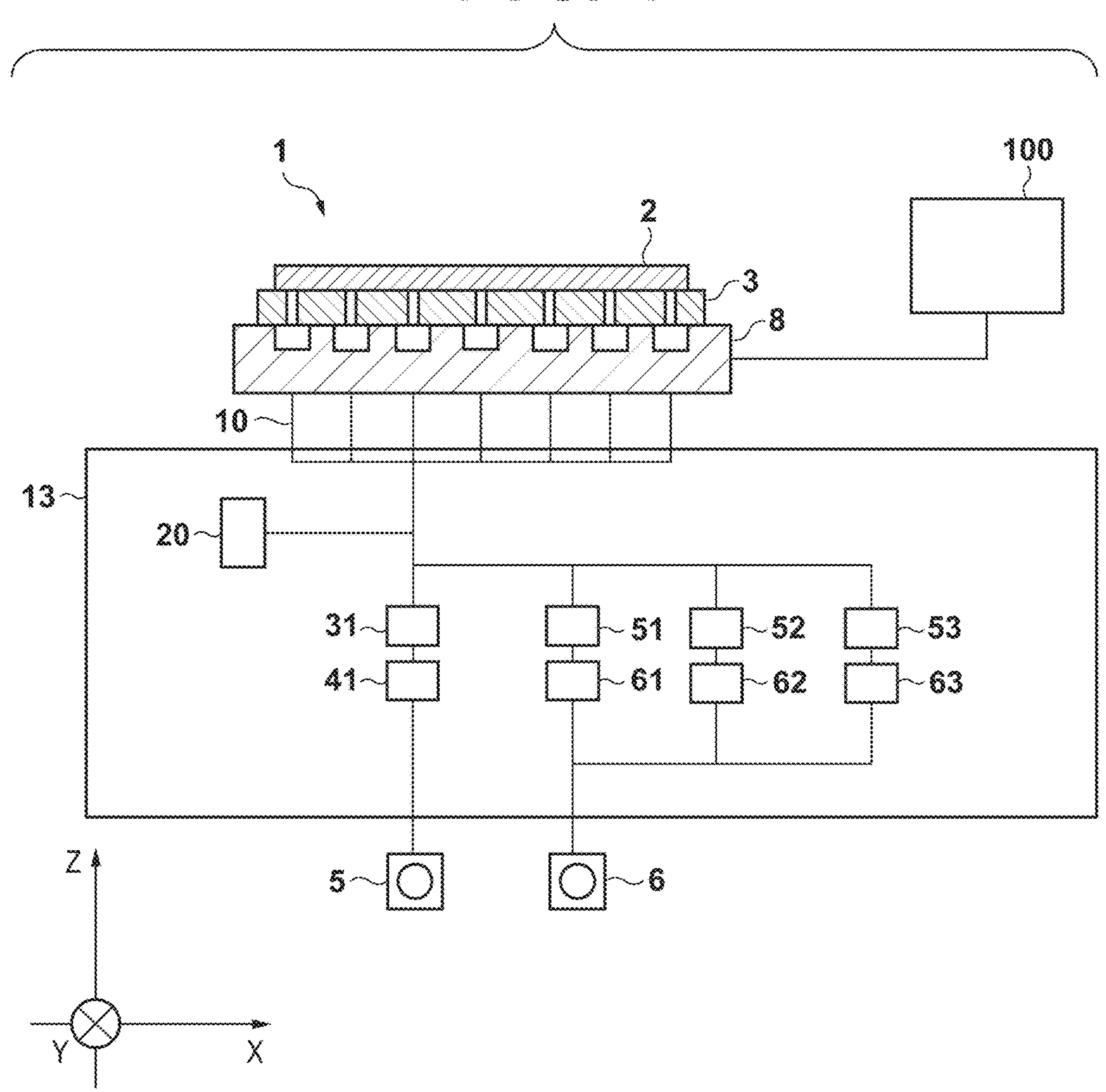
FIG. 1 is a view showing the arrangement of a substrate stage.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

The present disclosure relates to a substrate processing apparatus that processes a substrate. The substrate processing apparatus can be, for example, a lithography apparatus such as an exposure apparatus and an imprint apparatus that forms a pattern on a substrate. Alternatively, the substrate processing apparatus can be an inspection apparatus such as an overlay inspection apparatus, a CD inspection apparatus, a defect inspection apparatus, and an electric characteristic inspection apparatus. Alternatively, the substrate processing apparatus can be a processing apparatus such as an etching apparatus and a deposition apparatus. In the following description, the substrate processing apparatus in the present disclosure is assumed to be an exposure apparatus as an example of the lithography apparatus.

Figure 14:
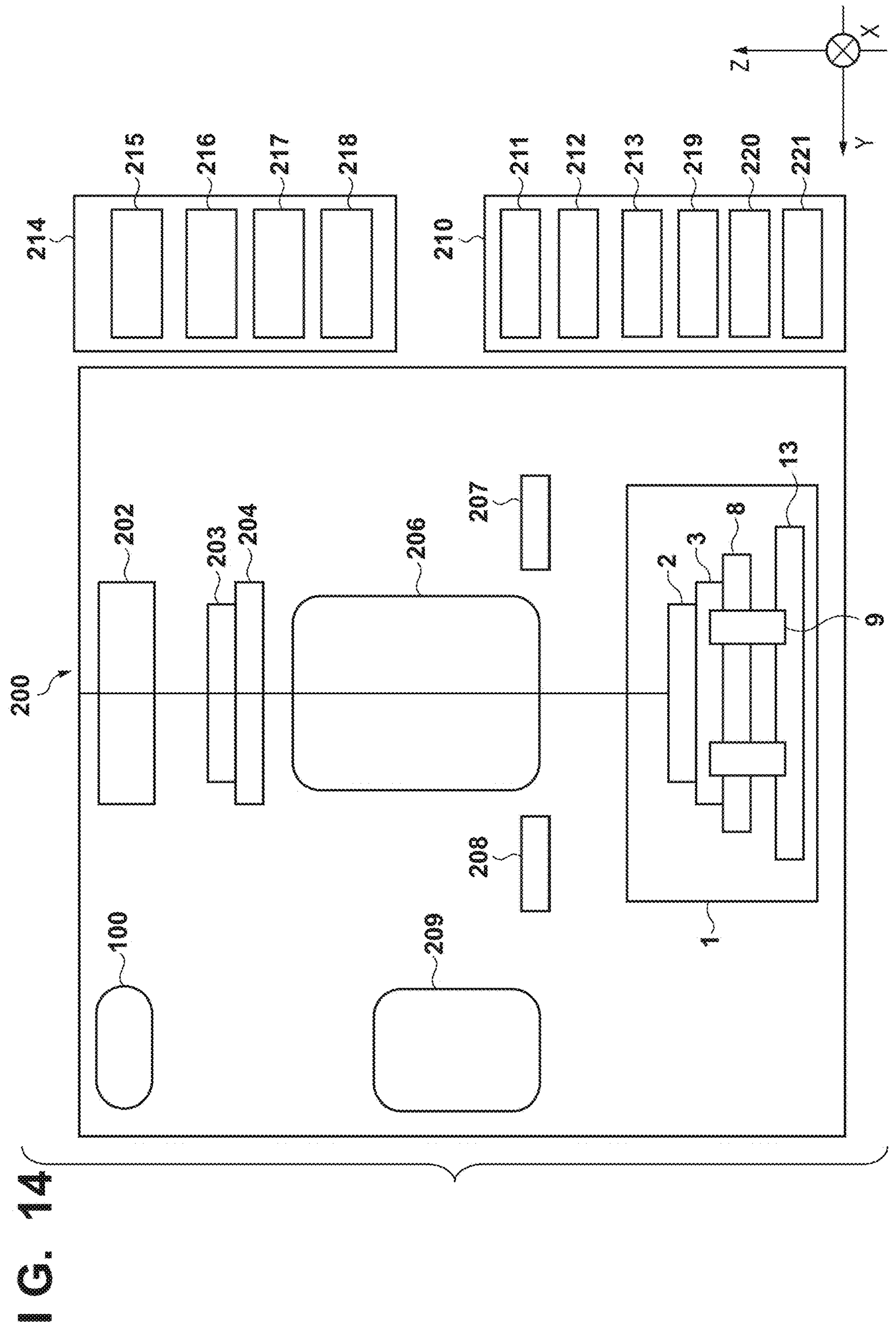
FIG. 14 is a schematic view showing the arrangement of an exposure apparatus.

FIG. 14 is a schematic view of an exposure apparatus 200 in an embodiment. In the specification and the drawings, directions will be indicated on an XYZ coordinate system in which a horizontal plane is defined as the X-Y plane. In general, a substrate 2 is placed on a substrate chuck 3 of a substrate stage 1 such that the surface of the substrate 2 is parallel to the horizontal plane (X-Y plane). Therefore, in the following description, the directions orthogonal to each other in a plane along the surface of the substrate 2 are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the OX direction, the OY direction, and the OZ direction, respectively.

In the exposure apparatus 200, exposure light guided from a light source (not shown) through an illumination optical system 202 is applied onto an original 203. The original can also be called a reticle, a mask, or the like. The exposure light passing through the original 203 passes through a projection optical system 206, and is applied to the substrate 2. As the material of the substrate, for example, glass, ceramic, a metal, a semiconductor, a resin, or the like can be used. A member made of a material different from that of the substrate may be provided on the surface of the substrate, as needed. The substrate is, for example, a silicon wafer, a semiconductor compound wafer, or silica glass.

An original stage 204 includes an original chuck (no shown) serving as an original holder. The original stage 204 holds the original 203 by the original chuck. The original stage 204 can linearly move in the X direction, the Y direction, and the Z direction, and rotate in the OX direction, the OY direction, and the OZ direction. These axes can be controlled independently.

To accurately measure the position of the original stage 204, a laser interferometer (not shown) is formed. The position of the original stage 204 can be specified from the change amount of the measurement value obtained by the laser interferometer.

An original conveyance system 214 can include an original hand 215, an original prealignment stage 216, an original conveyance robot 217, and a storage portion 218. The original conveyance robot 217 is an articulated robot. The original conveyance robot 217 includes a hand for holding the original 203, and can move the hand to an arbitrary position in the XYZ space. The storage portion 218 stores the original 203. The original 203 can be placed in the storage portion 218 from outside the apparatus. The original 203 placed in the storage portion 218 is placed on the original prealignment stage 216 by the original conveyance robot 217 as the articulated robot.

In the original prealignment stage 216, the position of the original 203 on the original prealignment stage 216 is measured by observing a mark on the original 203 by a microscope (not shown). After the measurement, the original hand 215 holds the original 203 on the original prealignment stage 216, and is driven in the +Y direction along a guide (not shown) to the position where it transfers the original 203 to the original stage 204. After the driving is completed, the original hand 215 is driven in the −Z direction to transfer the original 203 to the original stage 204. The original stage 204 holds the original 203 by vacuum suction. The X-direction, Y-direction, and Z-direction shifts of the original 203 with respect to the original prealignment stage 216 measured on the original prealignment stage 216 can be corrected by changing the position where the original stage 204 receives the original 203.

A substrate conveyance system 210 can include a supply hand 211, a collection hand 212, a storage portion 213, a prealignment unit 219, a conveyance robot 220, and a temporary placement base 221. The substrate 2 is stored in the storage portion 213. The conveyance robot 220 is an articulated robot. The conveyance robot 220 includes a hand for holding the substrate 2, and can move the hand to an arbitrary position in the XYZ space. The conveyance robot 220 takes the substrate 2 from the storage portion 213, and places the substrate 2 on the prealignment unit 219. In the prealignment unit 219, by applying measurement light to the outer peripheral portion of the substrate 2 and measuring reflected light by a sensor, the outer shape position of the substrate 2 with respect to the prealignment unit 219 is measured.

The supply hand 211 is a conveyance mechanism that conveys the substrate 2 from the prealignment unit 219 to the substrate stage 1, more specifically, onto pin members 9 formed on a coarse moving stage 13. The supply hand 211 can hold the substrate 2 by vacuum suction. The collection hand 212 is a conveyance mechanism that collects the substrate 2 from the substrate stage 1 and conveys it to the temporary placement base 221. The collection hand 212 can hold the substrate 2 by vacuum suction.

The temporary placement base 221 is a base for temporarily placing the substrate 2 collected from the substrate stage 1 by the collection hand 212. Since the conveyance robot 220 cannot directly take the substrate from the collection hand 212, it transfers the substrate 2 via the temporary placement base 221.

The substrate stage (substrate holding apparatus) 1 can include the coarse moving stage 13, and a fine moving stage 8 placed on the coarse moving stage 13. The substrate chuck 3 is mounted on the fine moving stage 8. The substrate chuck 3 is a holder that holds the substrate 2. The substrate chuck 3 can be a vacuum chuck that attracts the lower surface of the substrate 2 to the holding surface by vacuum suction. Alternatively, the substrate chuck 3 may be an electrostatic chuck that attracts the lower surface of the substrate 2 to the holding surface by an electrostatic interaction. Hereinafter, a description will be given assuming that the substrate chuck 3 is a vacuum chuck. The fine moving stage 8 is configured to be capable of linearly moving in the X direction, the Y direction, and the Z direction, and rotating in the OX direction, the OY direction, and the OZ direction. The substrate stage 1 includes a driving mechanism (not shown) that drives the fine moving stage 8 with respect to these axes, and these axes can be controlled independently.

To accurately measure the position of the fine moving stage 8, a laser interferometer (not shown) is formed. The position of the fine moving stage 8 can be specified from the displacement amount of the measurement value obtained by the laser interferometer.

The pin members 9 are used when receiving the substrate 2 from the supply hand 211 and when passing the substrate 2 to the collection hand 212. The pin members 9 can attract and hold the substrate 2. In order to stably support the substrate 2, for example, at least three pin members 9 can be arranged at or near the apexes of a possible largest triangle in a plane parallel to the holding surface of the substrate chuck 3. Each pin member 9 is arranged such that it extends through a hole formed in each of the fine moving stage 8 and the substrate chuck 3 and the longitudinal axis of the pin member is parallel to the direction (that is, the Z direction) perpendicular to the holding surface of the substrate chuck 3 (holder) for holding the substrate. The lower end of the pin member 9 is fixed to the coarse moving stage 13, and the upper end thereof is formed to be projectable/retractable from the holding surface of the substrate chuck 3. The pin member 9 functions as a support member that supports the substrate 2 by projecting from the holding surface. The projection/retraction operation of the pin member 9 from the holding surface of the substrate chuck 3 can be performed by at least one of expansion/contraction of the pin member 9, vertical movement of the coarse moving stage 13, and vertical movement of the fine moving stage 8.

The coarse moving stage 13 can linearly move in the X direction and the Y direction, and rotate in the OZ direction. The distance between the coarse moving stage 13 and the fine moving stage 8 can be measured using, for example, a capacitance sensor. Based on the measurement result, the position of the coarse moving stage 13 is controlled to follow the position of the fine moving stage 8 by using an actuator such as a linear motor. Since the pin members 9 are fixed to the coarse moving stage 13, they move together with the coarse moving stage 13.

An off-axis scope 209 can measure an alignment mark on the substrate 2.

A controller 100 controls the operation of the exposure apparatus 200. The controller 100 can include functions of drivers and controllers that control the sensor, actuator, and the like in the exposure apparatus 200.

The collection sequence of the substrate 2 in this embodiment will be described below. The collection sequence of the substrate 2 can include an operation of transferring the substrate 2 from the substrate chuck 3 to the pin members 9 after exposure is completed. This operation can be performed by relatively driving the substrate chuck 3 and the pin members 9 in the Z direction. Here, an adhesive force acts between the substrate 2 and the substrate chuck 3. In this specification, the adhesive force refers to a force required to separate the substrate 2 and the substrate chuck 3 by applying a force in the direction away from each other. That is, the adhesive force is related to the easiness of separation of the substrate 2 from the substrate chuck 3. Even if holding of the substrate 2 by the substrate chuck 3 is released, the adhesive force can remain depending on the characteristics of the holding surface of the substrate chuck 3, the characteristics of the substrate 2, the characteristics of the exposure process, the influence of a foreign substance sandwiched between the substrate 2 and the substrate chuck 3, and the like. In addition, even if the vacuum suction is released when unloading the substrate, it does not immediately reach atmospheric pressure, so that the residual pressure (residual suction force) can become the adhesive force. Also in a case where the substrate chuck 3 is an electrostatic chuck, an adhesive force can remain due to the electrostatic chuck and the charged substrate during the power-off state. If the adhesive force is strong, the substrate 2 is separated from the substrate chuck 3 against the adhesive force, and this may damage one or both of the substrate 2 and the substrate chuck 3.

To solve this problem, in this embodiment, when releasing holding of the substrate 2 by the substrate chuck 3, a gas is supplied between the substrate 2 and the substrate chuck 3 to facilitate their separation. However, if the supply amount of the gas when separating the substrate 2 from the substrate chuck 3 is excessively large with respect to the adhesive force, the substrate 2 floats from the substrate chuck 3 and the substrate 2 slides laterally. On the other hand, if the supply amount of the gas when separating the substrate 2 from the substrate chuck 3 is excessively small with respect to the adhesive force, the substrate 2 is not separated from the substrate chuck 3, thereby causing the substrate chuck 3 to wear. Since the adhesive force is caused by the characteristics of the substrate 2, the characteristics of the substrate chuck 3, the characteristics of the exposure process, and the like, the gas supply for separating the substrate 2 from the substrate chuck 3 needs to be appropriately set each time in accordance with the adhesive force.

Holding and releasing of the substrate 2 by the substrate chuck 3, and the control of gas supply between the substrate 2 and the substrate chuck 3 will be described below.

FIG. 1 is a schematic view showing the arrangement of the substrate stage 1. The substrate chuck 3 is configured to hold the substrate 2 by decompressing the space between the substrate 2 and the substrate chuck 3 and attracting the substrate 2 to the holding surface by vacuum suction. The substrate chuck 3 is held on the fine moving stage 8 by vacuum suction. The fine moving stage 8 is mounted on the coarse moving stage 13.

A gas flow path 10 is arranged in the coarse moving stage 13. The gas flow path 10 is arranged so that a gas is sucked from between the substrate 2 and the substrate chuck 3 by a vacuum pump 5 (vacuum source), which is a negative pressure generating means, through openings formed in the surface of the substrate chuck 3 facing the substrate 2. Further, the gas flow path 10 is arranged so that a gas from a positive pressure tank 6, which is a positive pressure generating means (gas supply source), is supplied between the substrate 2 and the substrate chuck 3 through the openings. A pressure sensor 20, regulators 41, 61, 62, and 63, and solenoid valves 31, 51, 52, and 53 are provided on the gas flow path 10. Note that the gas flow path 10 is, for example, a pipe through which the gas flows (a pipe that allows the gas to flow therethrough). The gas flow path 10, the regulators, the solenoid valves, and the like, which are members or mechanisms for supplying the gas to the space between the substrate 2 and the substrate chuck 3, may be collectively referred to as a gas supplier. Alternatively, the gas flow path 10 may be referred to as the gas supplier.

A plurality of openings 7 (see FIG. 3) are formed in the surface of the substrate chuck 3 facing the substrate 2. The gas flow path 10 branches and leads to each opening. Furthermore, the gas flow path 10 is connected to the vacuum pump 5 via the solenoid valve 31 and the regulator 41, and is connected to the positive pressure tank 6 via the solenoid valves 51, 52, and 53 and the regulators 61, 62, and 63. In general, the vacuum pump 5 and the positive pressure tank 6 are configured as factory facilities, so that they are installed outside the substrate stage 1.

The pressure in the gas flow path 10 is measured by the pressure sensor 20. In an example, the pressure sensor 20 is arranged to measure the pressure in the gas flow path 10 at a position on the vacuum pump side of the branch of the gas flow path 10 and on the substrate chuck 3 side of the solenoid valves 31, 51, 52, and 53. This is to enable the pressure sensor 20 to accurately measure the pressure in the space between the substrate 2 and the substrate chuck 3.

The regulator 41 and the solenoid valve 31 are arranged between the vacuum pump 5 and the substrate chuck 3. The regulator 41 is configured to be capable of regulating the pressure in the gas flow path 10 to a desired vacuum pressure. The solenoid valve 31 is arranged on the substrate chuck 3 side of the regulator 41. This is to supply the pressure regulated by the regulator 41 to the substrate chuck 3. When the solenoid valve 31 is turned on, the vacuum pump 5 regulates the pressure in the space between the substrate 2 and the substrate chuck 3. When the solenoid valve 31 is turned off, the pressure in the space between the substrate 2 and the substrate chuck 3 is not regulated.

The regulators 61, 62, and 63 and the solenoid valves 51, 52, and 53 are arranged between the positive pressure tank 6 and the substrate chuck 3. The regulators 61, 62, and 63 are configured to be capable of regulating the pressure in the gas flow path 10 supplied from the positive pressure tank 6. If the supplied pressure can be regulated, the supply flow rate can also be regulated. The solenoid valves 51, 52, and 53 are arranged on the gas flow path 10 on the substrate chuck 3 side of the regulators 61, 62, and 63. When the solenoid valves 51, 52, and 53 are turned on, the positive pressure tank 6 regulates the pressure in the space between the substrate 2 and the substrate chuck 3. When the solenoid valves 51, 52, and 53 are turned off, the pressure in the space between the substrate 2 and the substrate chuck 3 is not regulated. Note that FIG. 1 shows three sets of regulators and solenoid valves between the positive pressure tank 6 and the substrate chuck 3, but the number of sets is not limited to a specific number. The number of sets may be one, or four or more. Instead of the combination of the solenoid valve and the regulator, a servo valve whose opening/closing degree can be freely set may be formed.

When holding the substrate 2 by the substrate chuck 3 by vacuum suction, the solenoid valve 31 is turned on and the solenoid valves 51, 52, and 53 are turned off. With this, the vacuum pump 5 can reduce the pressure in the space between the substrate 2 and the substrate chuck 3. When releasing the substrate 2 from the substrate chuck 3, the solenoid valve 31 is turned off and at least one of the solenoid valves 51, 52, and 53 is turned on. With this, the space between the substrate 2 and the substrate chuck 3 can be pressurized with the gas from the positive pressure tank 6.

By changing the settings of the regulators 61, 62, and 63, respectively, it is possible to change the flow rate and pressure of the gas which fills the space between the substrate 2 and the substrate chuck 3 when any one of the solenoid valves 51, 52, and 53 is turned on. In an example, the regulators 61, 62, and 63 are set such that the gas supply flow rates of the regulators 61, 62, and 63 increase in this order. When releasing holding of the substrate 2 by the substrate chuck 3, the controller 100 controls the gas supply via the gas flow path 10 and the openings 7 based on the information concerning the adhesive force of the substrate 2 to the holding surface (the information concerning the easiness of separation), which is obtained in advance. For example, the controller 100 decides one of the solenoid valves 51, 52, and 53 to be turned on and the gas supply time based on the information concerning the adhesive force of the substrate 2 to the holding surface (the information concerning the easiness of separation).

The controller 100 can be formed from, for example, a general-purpose or dedicated processor with a program installed in a memory. Alternatively, the controller 100 may be formed from a Programmable Logic Device (PLD) such as a Field Programmable Gate Array (FPGA) or an Application Specific Integrated Circuit (ASIC). Alternatively, the controller 100 may be formed from a combination of all or some of the processor, the PLD, and the ASIC. Note that the controller 100 may be formed in the exposure apparatus 200, or may be formed outside the exposure apparatus 200. When the controller 100 is formed outside the exposure apparatus 200, for example, the functions of the controller 100 are installed in a server apparatus or the like connected to the exposure apparatus 200 so as to be able to communicate therewith.

FIG. 2 shows the functional arrangement of the controller 100. The controller 100 can include an instruction unit 110, a storage unit 120, and a processing unit 130. The instruction unit 110 instructs the control amounts to respective driving units including the fine moving stage 8. The storage unit 120 stores various data and programs related to exposure control. The processing unit 130 executes various processes related to exposure control. For example, the processing unit 130 calculates the drive target positions of the substrate stage 1 and the original stage 204. Furthermore, the processing unit 130 executes an exposure sequence and a substrate supply and collection sequence in accordance with the control program stored in the storage unit 120.

The function of the processing unit 130 will be described later. Note that FIG. 2 shows an example in which the controller 100 includes the storage unit 120 and the processing unit 130, but the storage unit 120 and the processing unit 130 may be provided separately from the controller 100.

FIG. 3 is a plan view of the substrate chuck 3 when viewed from the +Z direction. The substrate chuck 3 is provided with an annular seal portion 60 at a position along the outer periphery of the substrate chuck 3. However, the presence/absence, number, and arrangement of the seal portions 60 are not limited to the example shown in FIG. 3. For example, the substrate chuck 3 may be provided with no seal portion. Alternatively, a plurality of seal portions may be provided.

The surface of the substrate chuck 3 is provided with a plurality of protrusions (not shown), and the upper surfaces of the plurality of protrusions can serve as the holding surface for holding the substrate 2. The plurality of protrusions are referred to as chuck pins. The substrate chuck 3 is provided with the openings 7 connected to the gas flow path 10. FIG. 3 shows twelve openings 7, but the arrangement and number of the openings 7 are not limited to the example shown in FIG. 3.

The operation of holding the substrate 2 by the substrate chuck 3 by vacuum suction is performed by evacuating the gas in the space between the substrate 2 and the substrate chuck 3 through the openings 7. The seal portion 60 provided between the substrate 2 and the substrate chuck 3 can prevent the inflow of atmospheric air from the surroundings, thereby enabling vacuum suction.

The operation of releasing the substrate 2 from the substrate chuck 3 (the operation of separating the substrate 2 from the substrate chuck 3) is performed by supplying the gas between the substrate 2 and the substrate chuck 3 through the openings 7. Here, if the supply amount (pressure and flow rate) of the gas or the supply time of the gas is excessively large with respect to the adhesive force, the substrate 2 floats from the substrate chuck 3 and the substrate 2 slides laterally. On the other hand, if the supply amount of the gas or the supply time of the gas when separating the substrate 2 from the substrate chuck 3 is excessively small with respect to the adhesive force, the substrate 2 is not separated from the substrate chuck 3 and the substrate chuck wears when the substrate 2 is removed. A detailed description of the adhesive force and a method of optimizing the supply amount of the gas with respect to the adhesive force will be described later.

With reference to FIGS. 8A to 8C, a method of transferring the substrate 2 from the substrate chuck 3 to the pin members 9 will be described. Each of FIGS. 8A to 8C shows the schematic sectional view of the substrate stage 1. The fine moving stage 8 moves in the Z direction along the longitudinal direction of the pin member 9. Note that the fine moving stage 8 can move in the Z direction while tilting in correspondence with the Z positional relationship among the three pin members 9. The pin members 9 are arranged in the coarse moving stage 13 that can be driven in the X and Y directions. The Z-direction position of the pin member 9 can be measured using, for example, an interferometer, a capacitance sensor, or the like (not shown).

The pin members 9 are connected to the vacuum pump 5 via a gas flow path 70. A regulator 73 and a solenoid valve 72 are provided between the vacuum pump 5 and the pin members 9. The regulator 73 is configured to be capable of regulation to a desirable vacuum pressure. The solenoid valve 72 is arranged on the pin member 9 side of the regulator 73. This is to supply the pressure regulated by the regulator 73 to the substrate chuck 3. When the solenoid valve 72 is turned on, the vacuum pump 5 regulates the pressure in the space between the substrate 2 and the substrate chuck 3. When the solenoid valve 72 is turned off, the pressure in the space between the substrate 2 and the substrate chuck 3 is not regulated. A pressure sensor 71 is arranged to monitor the pressure between the pin members 9 and the substrate 2. The pressure sensor 71 needs to be arranged on the pin member 9 side of the solenoid valve 72. In FIGS. 8A to 8C, the pressure sensor 71, the solenoid valve 72, and the regulator 73 are arranged outside the coarse moving stage 13, but they may be arranged in the coarse moving stage.

In FIG. 8A, the fine moving stage 8 is located on the +Z direction side, and the substrate chuck 3 attracts the substrate 2 by vacuum suction. In FIG. 8B, since the fine moving stage 8 moves in the −Z direction, the pin members 9 come into contact with the substrate 2 and the fine moving stage 8 stops moving. After that, the controller 100 releases attraction-holding of the substrate 2 by the substrate chuck 3. At this time, the controller 100 controls the supply of the gas via the gas flow path 10 and the openings 7 based on the information concerning the adhesive force of the substrate 2 to the holding surface.

Thereafter, when the solenoid valve 72 is turned on, the pin members 9 attract and hold the substrate 2. Then, as shown in FIG. 8C, in the state where the pin members 9 attract and hold the substrate 2, the fine moving stage 8 further moves in the −Z direction. In this manner, the substrate 2 is transferred from the substrate chuck 3 to the pin members 9.

In the example shown in FIGS. 8A to 8C, the substrate 2 is transferred from the substrate chuck 3 to the pin members 9 by moving the fine moving stage 8. However, it is sufficient that the relative positions of the substrate chuck 3 and the pin members 9 can be changed. For example, the entire pin members 9 or the distal end portions thereof may be moved in the +Z direction. Changing the relative positions of the substrate chuck 3 and the pin members 9 is synonymous with relatively moving the substrate chuck 3 and the pin members 9.

Figure 9:
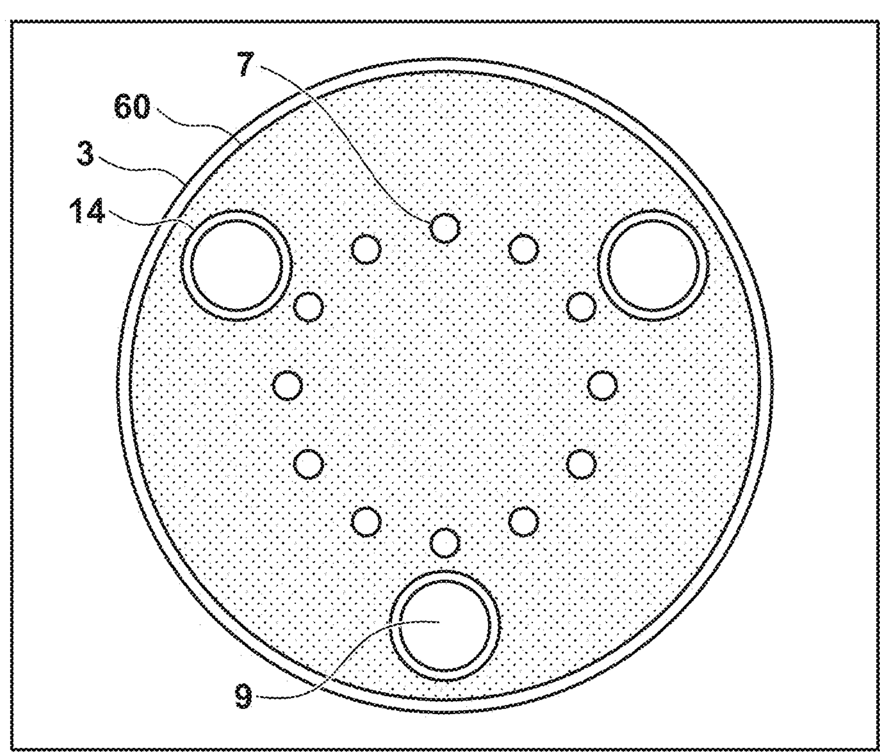
FIG. 9 is a plan view of the substrate chuck.

FIG. 9 is a plan view of the substrate chuck 3 when viewed from the +Z direction. The surface of the substrate chuck 3 is provided with the plurality of protrusions (chuck pins) (not shown), and the upper surfaces of the plurality of protrusions can serve as the holding surface for holding the substrate 2. The annular seal portion 60 is provided in the outer periphery of the substrate chuck 3 to prevent air from leaking out of the substrate chuck 3 while the substrate 2 is attracted by vacuum suction. The substrate chuck 3 includes the openings 7 connected to the gas flow path 10. The substrate chuck 3 holds the substrate 2 by vacuum suction through the openings 7. The space between the substrate 2 and the chuck pins is set in a vacuum state, and this enables attracting and holding the substrate 2 with a uniform force.

The substrate chuck 3 and the fine moving stage 8 are formed with holes 14 for passing the pin members 9 in the Z direction, so that the fine moving stage 8 can be driven in the Z direction without interfering with the pin members 9. FIG. 9 shows the holes 14 for passing the pin members 9. FIG. 9 shows the arrangement where three pin members 9 are provided, but the number of pin members 9 is not limited as long as the substrate 2 can be stably held depending on the size, material, and mass of the substrate 2.

FIGS. 8A to 8C show the example in which the fine moving stage 8 moves to cause the pin members 9 to attract and hold the substrate 2. However, it is sufficient that the relative positions of the substrate chuck 3 and the pin members 9 can be changed. For example, the entire pin members 9 or the distal end portions thereof may be moved in the +Z direction. Changing the relative positions of the substrate chuck 3 and the pin members 9 is synonymous with relatively moving the substrate chuck 3 and the pin members 9. Alternatively, a configuration may be employed in which, instead of moving the fine moving stage 8, the pin members 9 extend to attract and hold the substrate 2 by the pin members 9. In this manner, the substrate stage 1 can include a driving unit that drives the fine moving stage 8 and/or drives or deforms the pin members 9 to perform the operation of separating the substrate 2 and the substrate chuck 3.

Figure 10A:
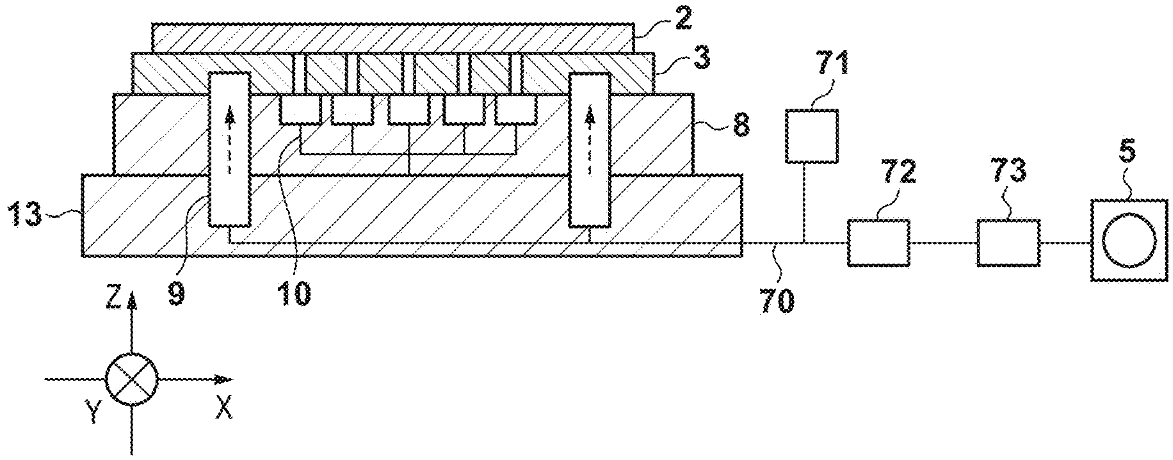
FIGS. 10A to 10C are views for explaining a substrate transfer operation.
Figure 10B:
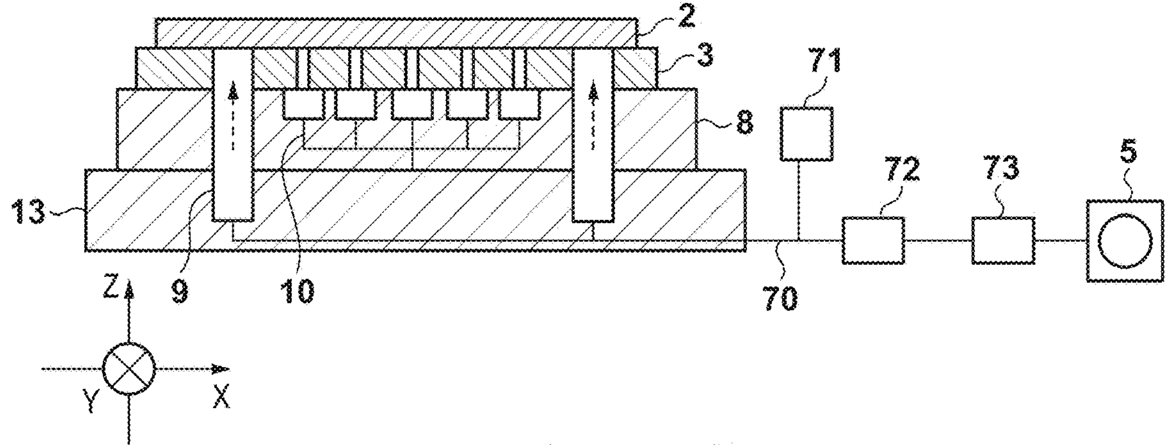
Figure 10C:
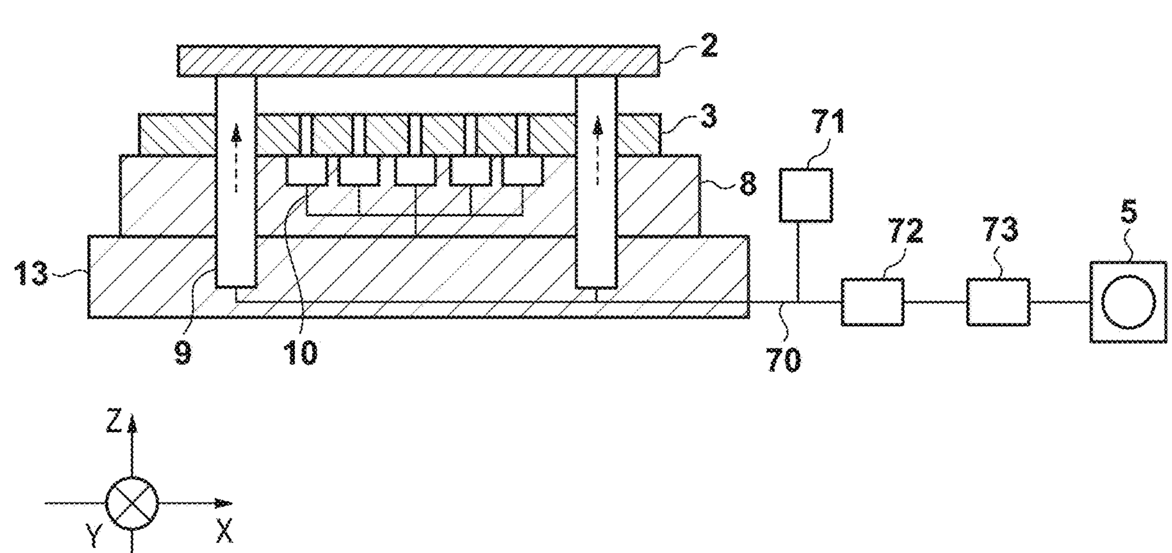

FIGS. 10A to 10C shows an example in which, instead of moving the fine moving stage 8, the pin members 9 extend to attract and hold the substrate 2 by the pin members 9. Hereinafter, movement of the position of the distal end of the pin member 9 due to the expansion/contraction of the pin member 9 is sometimes referred to as "movement of the pin member 9."

In FIG. 10A, the distal end portion of the pin member 9 on n the +Z direction side is located on the −Z direction side of the holding surface of the substrate chuck 3, and not in contact with the substrate 2. In this state, the substrate chuck 3 holds the substrate 2. In FIG. 10B, as the pin members 9 extend in the +Z direction, the pin members 9 come into contact with the substrate 2. The pin members 9 stop to extend at the position where they come into contact with the substrate 2. After that, the controller 100 releases attraction-holding of the substrate 2 by the substrate chuck 3. At this time, the controller 100 controls the gas supply via the gas flow path 10 and the openings 7 based on the information concerning the adhesive force of the substrate 2 to the holding surface (the information concerning the easiness of separation).

Thereafter, when the solenoid valve 72 is turned on, the pin members 9 attract and hold the substrate 2. Then, as shown in FIG. 10C, in the state in which the pin members 9 attract and hold the substrate 2, the pin members 9 further extend in the +Z direction. In this manner, the substrate 2 is transferred from the substrate chuck 3 to the pin members 9.

In the example shown in FIGS. 10A to 10C, the substrate 2 is transferred from the substrate chuck 3 to the pin members 9 by extending the pin members 9. However, the substrate 2 may be transferred from the substrate chuck 3 to the pin members 9 by moving the entire pin members 9. Note that the driving unit that drives the pin member 9 may be included within the pin member 9, or may be connected to the pin member 9.

Figure 11:
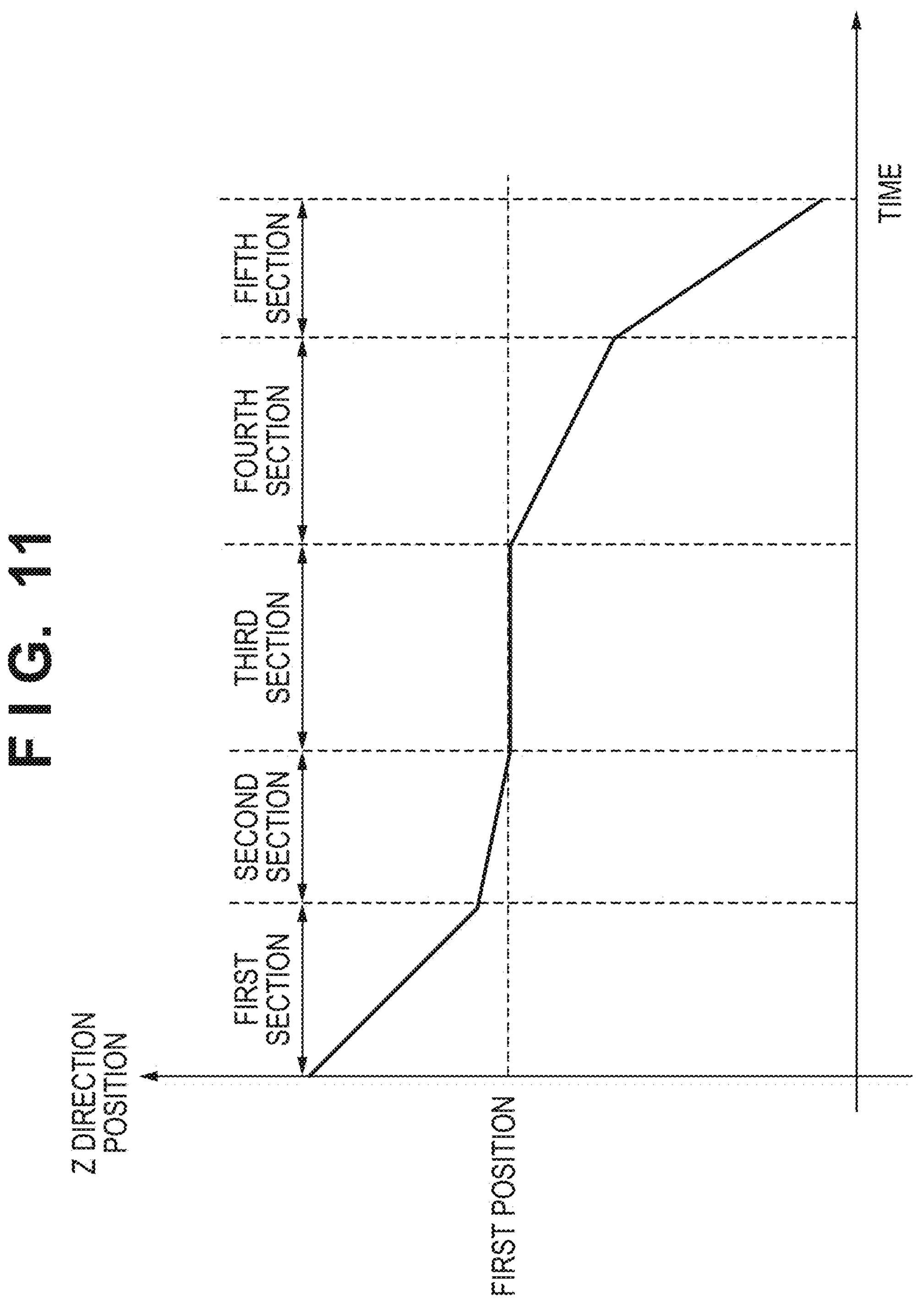
FIG. 11 is a graph showing the drive profile of a fine moving stage.

FIG. 11 is a graph showing the drive profile of the fine moving stage 8. FIG. 11 shows the relationship between time and the Z-direction position of the fine moving stage 8 in the operation of transferring the substrate 2 from the substrate chuck 3 to the pin members 9. Note that the change amount of the Z-direction position of the fine moving stage 8 is synonymous with the change amount of the Z-direction position of the substrate chuck 3.

In the first section, the instruction unit 110 instructs the fine moving stage 8 to set the first position stored in the storage unit 120 as the target position to move the fine moving stage 8 at high speed in the −Z direction. When driving the fine moving stage 8 in the −Z direction, the first position is set to be the same position as the Z-direction position of the fine moving stage 8 where the pin members 9 come into contact with the substrate 2, or the position on the +Z direction side of this position. Here, the example is shown in which the fine moving stage 8 moves in the −Z direction as in FIGS. 8A to 8C. However, since the case where the pin members 9 are moved in the +Z direction as in FIGS. 10A to 10C is different from this example only in the moving direction, FIG. 11 is applicable to the case by exchanging the −Z direction and the +Z direction in FIG. 11. The drawings and explanations described below can also be applied to the case where the pin members 9 are moved in the +Z direction by exchanging the −Z direction and the +Z direction. Furthermore, in a form where both the fine moving stage 8 and the pin members 9 are driven, moving the fine moving stage 8 in the Z direction in the explanation of FIG. 11 and the drawings described below may be replaced with an explanation of relatively moving the fine moving stage 8 and the pin members 9.

In the second section, the controller 100 moves the fine moving stage 8 at low speed in the −Z direction, and monitors the drive current value in the driving of the fine moving stage 8. By monitoring the drive current value while moving the fine moving stage 8 in the −Z direction, the controller 100 can detect the drive current value which changes when the pin members 9 come into contact with the substrate 2, thereby detecting that the pin members 9 have come into contact with the substrate 2. The reason why the fine moving stage 8 is driven at low speed in the second section is that the substrate 2 and the pin members 9 may be damaged if the substrate 2 is brought into contact with the pin members 9 at high speed. If it is detected that the pin members 9 have come into contact with the substrate 2 by monitoring the drive current value, the controller 100 stops moving the fine moving stage 8 in the −Z direction, and ends the second section. Note that the controller 100 may update the value of the first position stored in the storage unit 120 with the value of the Z-direction position of the fine moving stage 8 at the time of detection of the contact between the pin members 9 and the substrate 2 in the second section. By updating the first position in this manner, the time required for the second section can be reduced.

If the coordinates of the fine moving stage 8 when the substrate 2 comes into contact with the pin members 9 are the same as those of the first position, the substrate 2 and the pin members 9 are in contact with each other when the fine moving stage 8 has moved at the first position. In this case, at the same time as the start of the second section, it is detected that the substrate 2 and the pin members 9 have come into contact from the drive current value. Hence, the fine moving stage 8 is not moved at low speed in the second section, and the operation transitions to the third section. Note that if it is known that the coordinates of the fine moving stage 8 when the substrate 2 and the pin members 9 come into contact are the same as those of the first position, the second section may be omitted and the operation may transition to the third section after the first section. In the third section, the controller 100 stops suction of the gas between the substrate 2 and the substrate chuck 3, and in parallel therewith, supplies a gas between the substrate 2 and the substrate chuck 3. At this time, the gas is supplied in accordance with the adhesive force to prevent the substrate 2 from floating from the substrate chuck 3 and sliding laterally. This can also suppress that, in the fourth section described below, the substrate 2 is forcibly separated from the substrate chuck 3 while the adhesive force remains, thereby causing the substrate chuck 3 to wear due to sliding between the substrate 2 and the substrate chuck 3. In the third section, the pin members 9 also start to suck the gas between the substrate 2 and the pin members 9. In the third section, the controller 100 can estimate the adhesive force based on the characteristics of the substrate 2, the characteristics of the substrate chuck 3, the characteristics of the exposure process, and the like, thereby optimizing the gas supply parameters and supplying the gas. The estimation of the adhesive force and the supply of the gas will be described later.

In the fourth section, the controller 100 moves the fine moving stage 8 at low speed in the −Z direction, thereby separating the substrate 2 and the substrate chuck 3 by a small distance. If the fine moving stage 8 is moved at high speed in the −Z direction to forcibly separate the substrate 2 from the substrate chuck 3 while the adhesive force exists, the substrate 2 will slide laterally on the substrate chuck 3 and cause the substrate chuck 3 to wear. The wear of the substrate chuck 3 affects the subsequent attraction-holding of the substrate 2. Therefore, in order to reduce the wear of the substrate chuck 3, in the third section, the gas is supplied between the substrate 2 and the substrate chuck 3 in accordance with the adhesive force.

In the fifth section, the fine moving stage 8 is moved at high speed in the −Z direction to the final position in the Z direction.

If the adhesive force between the substrate 2 and the substrate chuck 3 can be reduced by supplying the gas in the third section, the moving speed of the fine moving stage 8 in the fourth section can be increased. For example, it is also possible to eliminate the fifth section described below and drive the fine moving stage 8 at high speed in the −Z direction to the final position in the Z direction.

The method of estimating the adhesive force will be described. The adhesive force is the resultant force of the attraction pressure acting between the substrate 2 and the substrate chuck 3 and the adhesion force between the substrate 2 and each chuck pin of the substrate chuck 3. The adhesive force can be estimated based on the characteristics of the substrate 2, the characteristics of the substrate chuck 3, the characteristics of the exposure process, and the like. In an example, the adhesive force can be estimated based on at least one of the characteristics of the substrate 2 and the characteristics of the substrate chuck 3.

The characteristic of the substrate 2 includes, for example, at least one of the amount of warpage of the substrate 2, the roughness of the surface (back surface) of the substrate 2 which comes into contact with the holding surface of the substrate chuck 3, the type of a film formed on the substrate 2, the material of the substrate 2, and the thickness of the substrate 2. For example, if the substrate 2 is warped, the adhesive force between the substrate 2 and the substrate chuck 3 decreases. This is because the warpage of the substrate 2 causes a stress in a direction of separating the substrate 2 from the substrate chuck 3, and this reduces the degree of adhesion. On the other hand, if the substrate 2 is not warped, the degree of adhesion is high and the adhesive force is strong. The roughness of the back surface of the substrate 2 also influences the adhesive force. For example, if the back surface of the substrate 2 is not rough, the substrate 2 and the substrate chuck 3 strongly adhere to each other. This is a state in which the adhesive force is strong. On the other hand, if the back surface of the substrate 2 is rough, the substrate 2 and the substrate chuck 3 do not come into tight contact with each other, resulting in a weak adhesive force. If a film is formed on the back surface of the substrate, the type of the formed film can influence the adhesive force. Furthermore, the material and thickness of the substrate 2 also influence the weight of the substrate 2. The heavier the substrate, the more strongly the substrate 2 and the substrate chuck 3 adhere to each other. This is a state in which the adhesive force is strong.

The characteristic of the substrate chuck 3 includes at least one of the uniformity of the heights of the chuck pins (the flatness of the holding surface), the surface coating of the chuck pin (the surface roughness of the holding surface), the thickness and material of the chuck pin, and the like. The more uniform the heights of the chuck pins (the higher the flatness of the holding surface), the more strongly the substrate 2 and the substrate chuck 3 adhere to each other, resulting in a strong adhesive force. The thicker the chuck pin, the larger the contact area between the holding surface of the substrate chuck 3 and the substrate 2, resulting in a strong adhesive force. If the chuck pin is made of, for example, a material having fine particles, the substrate 2 and the substrate chuck 3 strongly adhere to each other, resulting in a strong adhesive force.

The characteristics of the exposure process can include the exposure time, the exposure amount, whether to perform θ correction driving, and the like. For example, if the exposure time is long, the duration of vacuum suction between the substrate 2 and the substrate chuck 3 becomes long, and the adhesion between the substrate 2 and the substrate chuck 3 becomes strong. If the exposure amount is large, the substrate 2 thermally expands. During exposure, since the substrate 2 is vacuum-sucked on the substrate chuck 3, the back surface of the substrate 2 is subjected to the internal stress but does not expand. However, once the vacuum suction is released, the internal stress is released and the substrate 2 expands. When the substrate 2 slightly slides laterally on the substrate chuck 3, the adhesive force between the substrate 2 and the substrate chuck 3 decreases. Furthermore, in the exposure sequence, when an alignment mark is observed with an off-axis scope, the substrate 2 may be shifted in the θZ direction on the substrate chuck 3. In order to rotate the substrate 2 in the θZ direction on the substrate stage 1, an operation called θ correction driving as described below may be performed. An example of rotating the substrate 2 by 200 μrad will be described. The controller 100 rotates the fine moving stage 8 by 200 μrad from the position of 0 μrad. Then, the controller 100 transfers the substrate 2 from the substrate chuck 3 to the pin members 9. In this state, the controller 100 rotates the fine moving stage 8 by −200 μrad to return it to the position of 0 μrad. The substrate 2 on the pin members 9 is not influenced by this rotation. In this state, the controller 100 transfers the substrate 2 to the substrate chuck 3 again. As a result, the substrate 2 is rotated by 200 μrad with respect to the substrate chuck 3. With this method, a shift in the θZ direction can be corrected. Since the substrate 2 is released from holding by the substrate chuck 3 once and then vacuum-sucked again, this means that the exposure time changes. In this manner, the adhesive force also changes in accordance with the exposure process.

As has been described above, if the characteristics of the substrate 2, the characteristics of the substrate chuck 3, and the characteristics of the exposure process are known, the adhesive force as a force acting between the substrate 2 and the substrate chuck 3 can be estimated. The adhesive force can be estimated by calculation using a simulator (not shown) that models the substrate 2 and the substrate chuck 3.

Next, a simulation of the transition of the adhesive force when the gas supply amount and the gas supply time are changed will be described. The larger the gas supply amount, the weaker the adhesive force between the substrate 2 and the substrate chuck 3 becomes. Even if the gas supply amount is the same, the adhesive force between the substrate 2 and the substrate chuck 3 becomes weaker as the gas supply time increases. The gas supply amount parameter and the gas supply time parameter are decided in advance such that the adhesive force approaches zero after the gas supply. This is the optimal gas supply parameter. In this manner, the information concerning the adhesive force of the substrate 2 to the holding surface of the substrate chuck 3 (the information concerning the easiness of separation) can be obtained in advance.

Figures 4A, 4B:
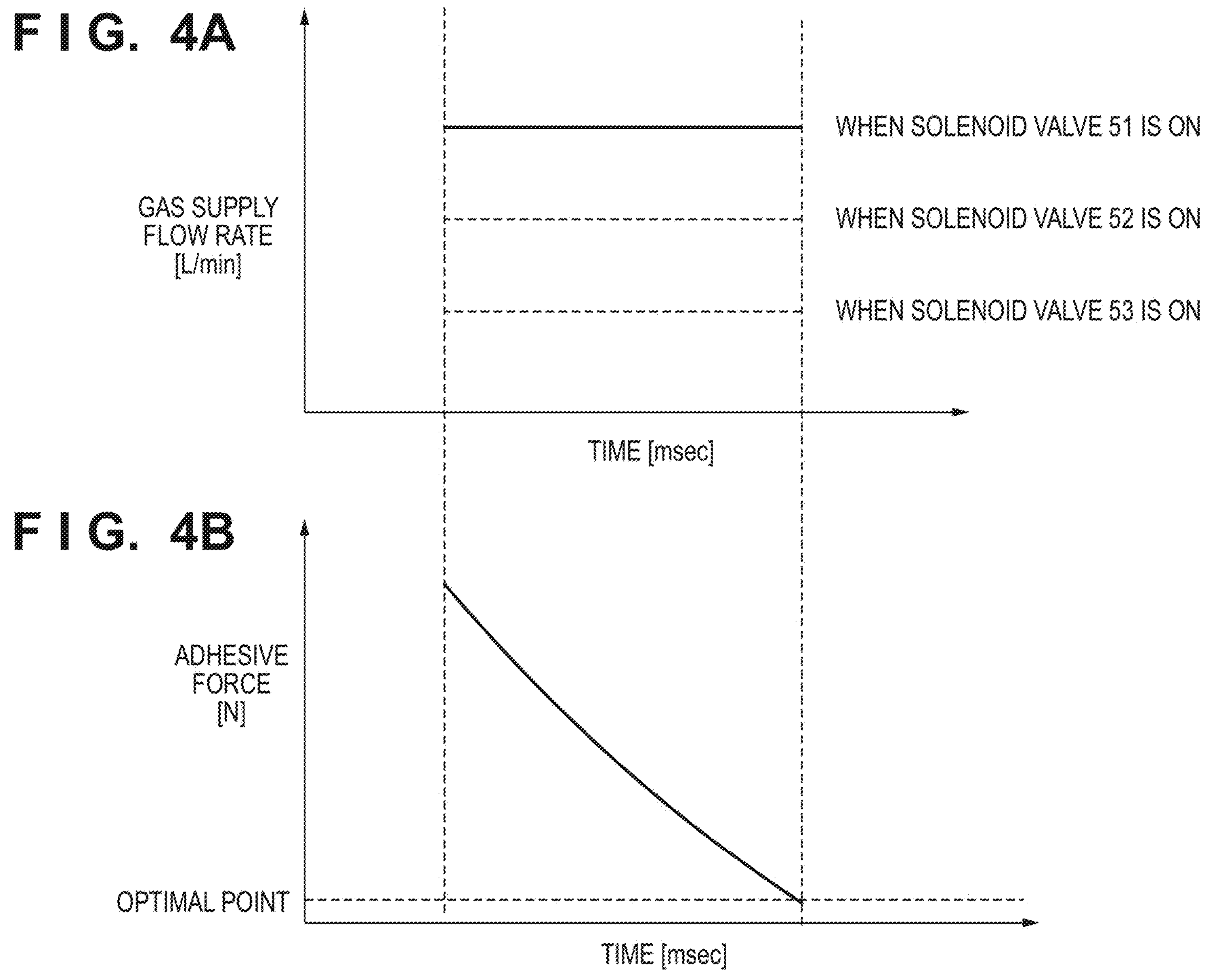
FIGS. 4A and 4B are graphs for explaining the gas supply control.

With reference to FIG. 4A, the gas supply control will be described. FIG. 4A shows an example of the temporal transition of the gas supply flow rate when releasing holding of the substrate 2 by the substrate chuck 3. FIG. 4A shows that the gas supply flow rate is constant when each solenoid valve is turned on. Here, the regulators 61, 62, and 63 are set such that their gas supply flow rates increase in this order. Accordingly, the supply flow rate of the gas supplied between the substrate 2 and the substrate chuck 3 increases in the order of the solenoid valves 51, 52, and 53 to be turned on.

FIG. 4A is a view assuming a case where the adhesive force between the substrate 2 and the substrate chuck 3 is large. The gas supply amount and the gas supply time are decided based on the results of the simulation performed in advance using the characteristics of the substrate 2 and the characteristics of the substrate chuck 3. The decided gas supply amount and gas supply time are stored in the storage unit 120. In FIG. 4A, the controller 100 (instruction unit 110) turns on the solenoid valve 51 in accordance with the gas supply amount stored in the storage unit 120. The length of time to turn on the solenoid valve 51 also follows the gas supply time stored in the storage unit 120.

FIG. 4B exemplarily shows the change of the adhesive force between the substrate 2 and the substrate chuck 3 during the gas supply under the gas supply control shown in FIG. 4A. During the gas supply, the adhesive force gradually decreases. If the adhesive force is decreased by the gas supply to the optimal point shown in FIG. 4B, the substrate 2 will not slide laterally on the substrate chuck 3 and the substrate chuck 3 will not wear. The point where the adhesive force is zero is not set as the optimal point because a small amount of adhesive force is left to prevent the substrate 2 from sliding laterally.

By changing the solenoid valve to be turned on, the amount of gas supplied between the substrate 2 and the substrate chuck 3 can be controlled. Furthermore, the solenoid valve can be controlled to be turned off to stop the gas supply after a predetermined time elapses from the start of the gas supply. This can create a state in which the substrate 2 does not slide laterally on the substrate chuck 3 and the substrate chuck 3 does not wear.

By setting optimal gas supply parameters, the adhesive force acting between the substrate 2 and the substrate chuck 3 is aimed to approach zero after the gas supply. If the adhesive force becomes negative, the gas supply is excessive, and the substrate 2 slides laterally on the substrate chuck 3. To the contrary, if the adhesive force is excessively large, wear occurs when separating the substrate 2 from the substrate chuck 3.

The gas supply control described above is effective when a specific type of substrate is placed in the exposure apparatus. In practice, substrates having different characteristics are placed. In a mass production factory for semiconductor devices, a specific number of substrates (for example, 25 substrates) having undergone the same manufacturing process are generally managed as one lot. Therefore, a job of the exposure process is input on a lot basis. It is assumed that the characteristics of substrates change for each lot.

In an example, optimal gas supply parameters are calculated in advance by performing a simulation while changing the characteristics of the substrate. The characteristics of the substrate and the optimal gas supply parameters are associated with each other and stored in the storage unit 120. For example, optimal gas supply parameters when the amount of warpage, which is one of the characteristics of the substrate, is 50 μm are obtained, and the amount of warpage of 50 μm and the gas supply parameters corresponding to this amount are associated with each other and stored in the storage unit 120. Similarly, optimal gas supply parameters when the amount of warpage is 100 μm are obtained, and the amount of warpage of 100 μm and the gas supply parameters corresponding to this amount are associated with each other and stored in the storage unit 120. When the substrate 2 with the amount of warpage of 50 μm is placed on the substrate stage 1, an input indicating that the amount of warpage of the substrate 2 is 50 μm is given to the controller 100. The processing unit 130 extracts the gas supply parameters corresponding to the amount of warpage of 50 μm from the storage unit 120. Based on the extracted parameters, the processing unit 130 transfers the operation amount of the selected solenoid valve to the instruction unit 110. The instruction unit 110 instructs the operation amount for the selected solenoid valve.

The characteristics of the substrate may be input to the controller 100 by a user via a user interface. Alternatively, the characteristics of the substrate may be input to the controller 100 via an external apparatus. The external apparatus can be, for example, a measuring instrument that measures the amount of warpage of the substrate. Alternatively, the characteristics of the substrate may be measured by the prealignment unit 219, and the measurement result may be input to the controller 100. Alternatively, information on the film type as the characteristic of the substrate may be input to the controller 100 from a deposition apparatus.

The characteristics of the substrate chuck 3 may change. For example, assume that the weight of the substrate is heavy and the chuck pin of the substrate chuck 3 is thicker. In this case, the simulation is performed while changing the characteristics of the substrate and the characteristics of the substrate chuck, thereby calculating optimal gas supply parameters for each characteristic.

The characteristics of the substrate and the characteristics of the substrate chuck are input to the controller 100. The processing unit 130 extracts, from the storage unit 120, the parameters corresponding to the input. Based on the extracted parameters, the processing unit 130 transfers the operation amount of the selected solenoid valve to the instruction unit 110. The instruction unit 110 instructs the operation amount for the selected solenoid valve.

The characteristics of the substrate chuck may be input to the controller 100 by a user via a user interface. Alternatively, the type of the substrate chuck 3 may be converted into the characteristics of the substrate chuck 3 and input to the controller 100. For example, the type of chuck is printed on the substrate chuck 3. The printing may be characters such as Japanese, English, or numbers, or may be a bar code or a two-dimensional bar code. When a reader that reads the printing is arranged in the apparatus, the type of the substrate chuck 3 can be determined from the result read by the reader, converted (specified) into information such as the thickness and material of the pin, which are characteristics of the substrate chuck 3, and input to the controller 100.

The example has been described above in which gas supply parameters are obtained in advance by simulation and gas supply is performed based on the optimal parameters. By obtaining the parameters in advance, the calculation amount in the processing unit 130 can be reduced. Further, the time required to release the substrate chuck 3 from the substrate 2 can be shortened.

If the calculation time is allowed, it is also possible to input the characteristics of the substrate 2 and the characteristics of the substrate chuck 3 to the controller 100 and execute a simulator in the processing unit 130. The processing unit 130 as the simulator calculates the adhesive force based on the characteristics of the substrate 2 and the characteristics of the substrate chuck 3, and decides optimal parameters for the substrate in accordance with the calculated adhesive force. Thereafter, the processing unit 130 can instruct the instruction unit 110 to operate the solenoid valve.

In the method in which the adhesive force is actually measured, a plurality of substrates with different characteristics and a plurality of substrate chucks with different characteristics are prepared, and the adhesive force is measured by supplying the gas while changing the combination. With this, the relationship among the characteristics of the substrate, the characteristics of the substrate chuck, and the adhesive force can be obtained. Based on the relationship, the controller 100 can provide gas supply parameters corresponding to the adhesive force.

In the third section (FIG. 11) where the gas is supplied, the lateral sliding of the substrate can be detected using the pressure sensor 71 that measures the pressure between the substrate 2 and the pin members 9. In the third section, the solenoid valve 72 is turned on, and the substrate 2 is vacuum-held by the pin members 9. Here, if an excessive amount of gas is supplied between the substrate 2 and the substrate chuck 3, the substrate 2 and the pin members 9 are separated and the substrate 2 slides laterally. Atmospheric air flows into the pin members 9, and the pressure in the gas flow path 70 increases. By detecting the increase in pressure in the gas flow path 70 using the pressure sensor 71, the lateral slide of the substrate can be detected.

Figure 15:
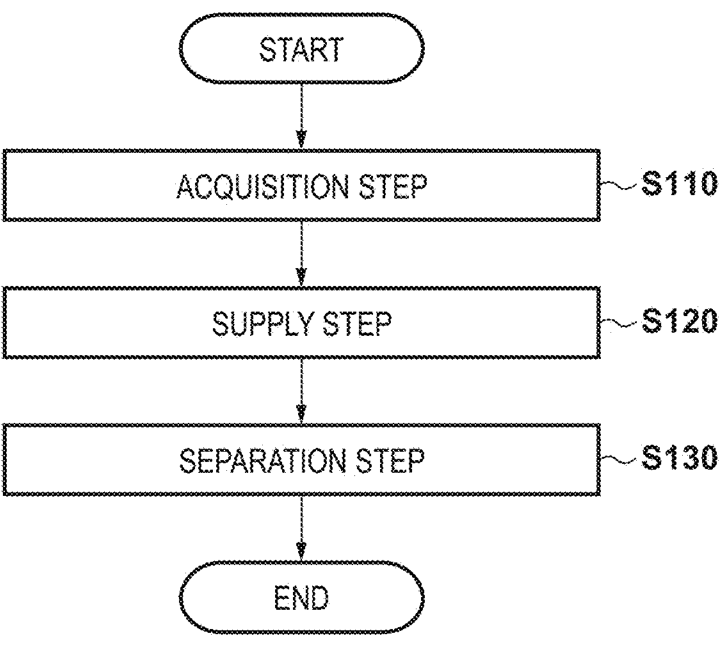
FIG. 15 is a flowchart showing a method of separating a substrate from a substrate chuck.

FIG. 15 is a flowchart showing a method of separating the substrate 2 from the substrate chuck 3. First, an acquisition step (step S110) of acquiring information concerning the adhesive force between the substrate 2 and the substrate chuck 3 is performed. Next, a supply step (step S120) of supplying a gas between the substrate 2 and the substrate chuck 3 based on the information concerning the adhesive force acquired in the acquisition step is performed. After supply of the gas is started in the supply step, a separation step (step S130) of separating the substrate 2 from the substrate chuck 3 is performed.

The substrate stage (substrate holding apparatus) 1 according to this embodiment includes the substrate chuck (holder) 3 for holding the substrate 2, and the gas supplier that supplies a gas between the substrate 2 and the substrate chuck 3. When separating the substrate 2 from the substrate chuck 3 holding the substrate 2, the gas supplier supplies a gas based on the information concerning the adhesive force between the substrate 2 and the substrate chuck 3. Thus, wear of each of the substrate 2 and the substrate chuck 3 can be suppressed.

Second Embodiment

In the first embodiment, it has been described that the adhesive force is estimated in accordance with the characteristics of the substrate, the characteristics of the substrate chuck, and the like. In the second embodiment, a method of obtaining the adhesive force from the measurement value of a pressure sensor 20 will be described.

Figure 13:
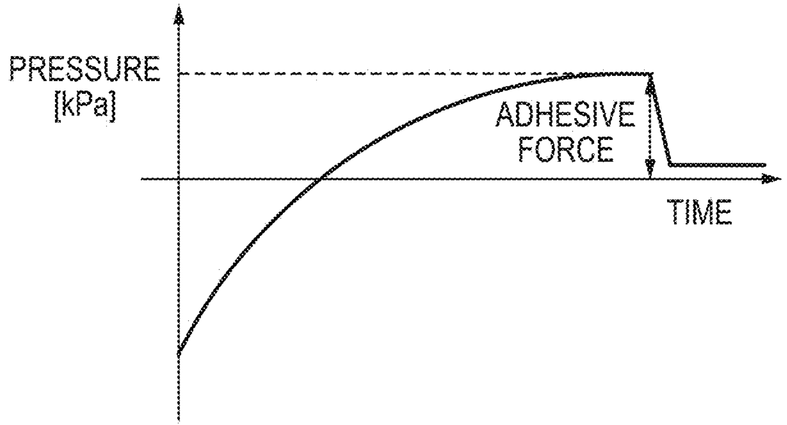
FIG. 13 is a graph showing the temporal change of the pressure during gas supply.

A controller 100 releases the vacuum suction of a substrate 2 by a substrate chuck 3, and monitors the measurement value of the pressure sensor 20 during gas supply. FIG. 13 shows the temporal change of the measurement value (pressure) of the pressure sensor 20 during gas supply. FIG. 13 shows the pressure change from the start of gas supply after releasing the vacuum suction. The abscissa represents time, and the ordinate represents the pressure. Since a gas is supplied, the pressure in the space between the substrate 2 and the substrate chuck 3 increases as time elapses. At the time when the measurement value of the pressure sensor 20 indicates 0, the pressure in the space between the substrate 2 and the substrate chuck 3 is zero. From this point of time, a force that counteracts the adhesive force between the substrate 2 and the chuck pins of the substrate chuck 3 is generated. At a certain point of time, atmospheric air enters through a seal portion 60 and the substrate 2, and the pressure between the substrate 2 and the substrate chuck 3 drops. At this time, the substrate 2 and the chuck pins of the substrate chuck 3 are assumed to be separated, so that the pressure immediately before the pressure drop is considered to be the adhesive force. In a case where no pressure drop occurs, the supply amount of the gas is preferably increased.

Based on the adhesive force, optimal gas supply parameters can be obtained by the simulation described in the first embodiment. Since the adhesive force can be obtained using the pressure sensor 20 as described above, the gas supply parameters can be optimized in the exposure apparatus without using a simulator. For example, at the time immediately before the start of pressure drop measured by the pressure sensor 20 shown in FIG. 13, the adhesive force reaches the optimal point shown in FIG. 4B. By stopping the gas supply immediately before the pressure drop measured by the pressure sensor 20, the supply amount of the gas can also be optimized in the exposure apparatus.

It is also possible to use the method of obtaining the adhesive force from the measurement value of the pressure sensor 20 according to this embodiment together with the method of estimating the adhesive force described in the first embodiment. For example, the adhesive force may be estimated using the method described in the first embodiment, and the adhesive force may be obtained using both the estimation result and the adhesive force obtained from the measurement value of the pressure sensor 20. More specifically, a correction value is obtained by multiplying, by a coefficient, the difference between the estimation result of the adhesive force and the value of the adhesive force obtained from the measurement value of the pressure sensor 20, and the estimation result of the adhesive force may be corrected using the obtained correction value.

Third Embodiment

As has been described above, the fine moving stage 8 can be driven in the Z direction (the first direction orthogonal to the holding surface) by a driving mechanism (not shown). The Z-direction position of the fine moving stage 8 at this time can be measured by the laser interferometer (measurement unit) (not shown).

In the second embodiment, the method of obtaining the adhesive force from the pressure value measured by the pressure sensor 20 has been described. In the third embodiment, a method of obtaining the adhesive force from the Z deviation will be described. The Z deviation is the difference between the target position of a substrate chuck 3 in the Z direction and the current position of the substrate chuck 3 in the Z direction measured by a laser interferometer (measurement unit). This is equivalent to the difference between the target position of a fine moving stage 8 in the Z direction instructed by an instruction unit 110 and the position of the fine moving stage 8 in the Z direction measured by a laser interferometer (not shown). This is also equivalent to the difference between the target position of a pin member 9 in the Z direction and the position of the pin member 9 in the Z direction measured by a laser interferometer (not shown).

Figure 12:
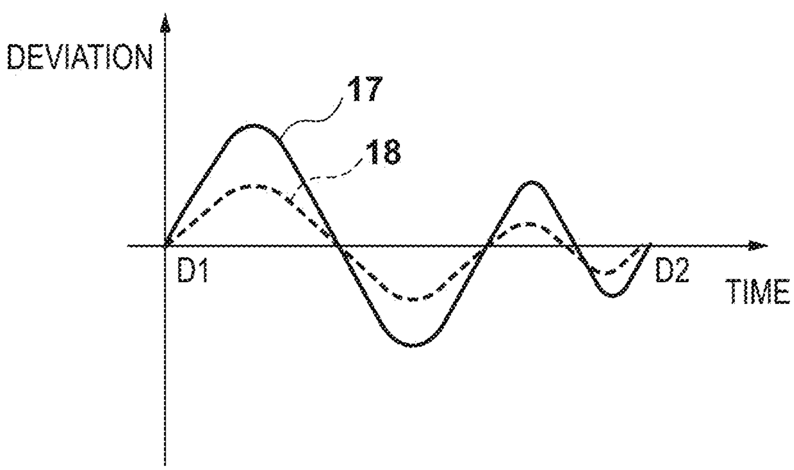
FIG. 12 is a graph showing the temporal transition of the Z deviation of a fine moving stage.

The adhesive force can be obtained from the Z deviation in the fourth section (FIG. 11). FIG. 12 is a graph showing the temporal transition of the Z deviation. In FIG. 12, D1 indicates the start time of the fourth section (the end time of the third section), and D2 indicates the end time of the fourth section (the start time of the fifth section). In this embodiment, a controller 100 controls the fine moving stage 8 based on the Z deviation (first condition) acquired in advance. As has been described above, when moving the fine moving stage 8 at low speed in the −Z direction in the fourth section, the substrate 2 and the substrate chuck 3 can be difficult to be separated due to the adhesive force. In this case, since the fine moving stage 8 cannot be moved to the target position instructed by the instruction unit 110 (the substrate chuck 3 or the pin members 9 cannot be moved to the target position), the actual position is different from the target position in the Z direction, and the Z deviation is generated. A processing unit 130 calculates the Z deviation as the difference between the target position of the fine moving stage 8, the substrate chuck 3, or the pin member 9 in the Z direction and the actual position in the Z direction measured by a sensor (not shown). The Z deviation is indicated by, for example, a waveform 17 in FIG. 12. Note that a waveform 18 indicates the Z deviation as a reference. The waveform 18 as a reference is a reference waveform that indicates the Z deviation in a case where the fine moving stage 8 is moved without holding a substrate 2.

In this embodiment, the absolute value of the Z deviation value at the time when the acquired Z deviation is the maximum value or the minimum value is defined as the Z deviation representative value. Further, the representative value of the Z deviation as the reference when the fine moving stage 8 is moved without placing the substrate 2 on the substrate chuck 3 is defined as the Z deviation reference value. The maximum value or the minimum value of the Z deviation is the maximum value or the minimum value of the Z deviation representative values from the time when the substrate 2 comes into contact with the pin members 9 to the time when the entire surface of the substrate 2 is separated from the substrate chuck 3. The processing unit 130 obtains, from the waveform of the acquired Z deviation, the absolute value of the Z deviation value when the Z deviation is maximum or minimum. This absolute value is set as the Z deviation representative value. The adhesive force is obtained based on the difference between the Z deviation representative value and the Z deviation reference value. Based on the adhesive force, optimal gas supply parameters can be obtained by the simulation described in the first embodiment. Since the adhesive force can be obtained based on the Z deviation, the gas supply parameters can be optimized in the exposure apparatus without using a simulator. For example, from the state indicated by the waveform 17 in FIG. 12, as the supply amount and/or supply time of the gas is increased, the Z deviation approaches the waveform 18 in FIG. 12. Immediately before the Z deviation approaches the waveform 18, the adhesive force reaches the optimal point shown in FIG. 4B. The gas supply parameter immediately before the Z deviation overlaps the waveform 18 is optimal. In this manner, it is also possible to optimize the supply amount of the gas in the exposure apparatus.

Like the second embodiment, this embodiment may be used together with the estimation result of the adhesive force according to the first embodiment. Alternatively, this embodiment may be used together with the second embodiment, or this embodiment may be used together with both the first and second embodiments.

Fourth Embodiment

In the first embodiment, the gas supply amount is constant (FIG. 4A). In the fourth embodiment, an example will be described in which the gas supply amount is changed in accordance with the elapse of time from the start of gas supply.

Figures 5A, 5B:
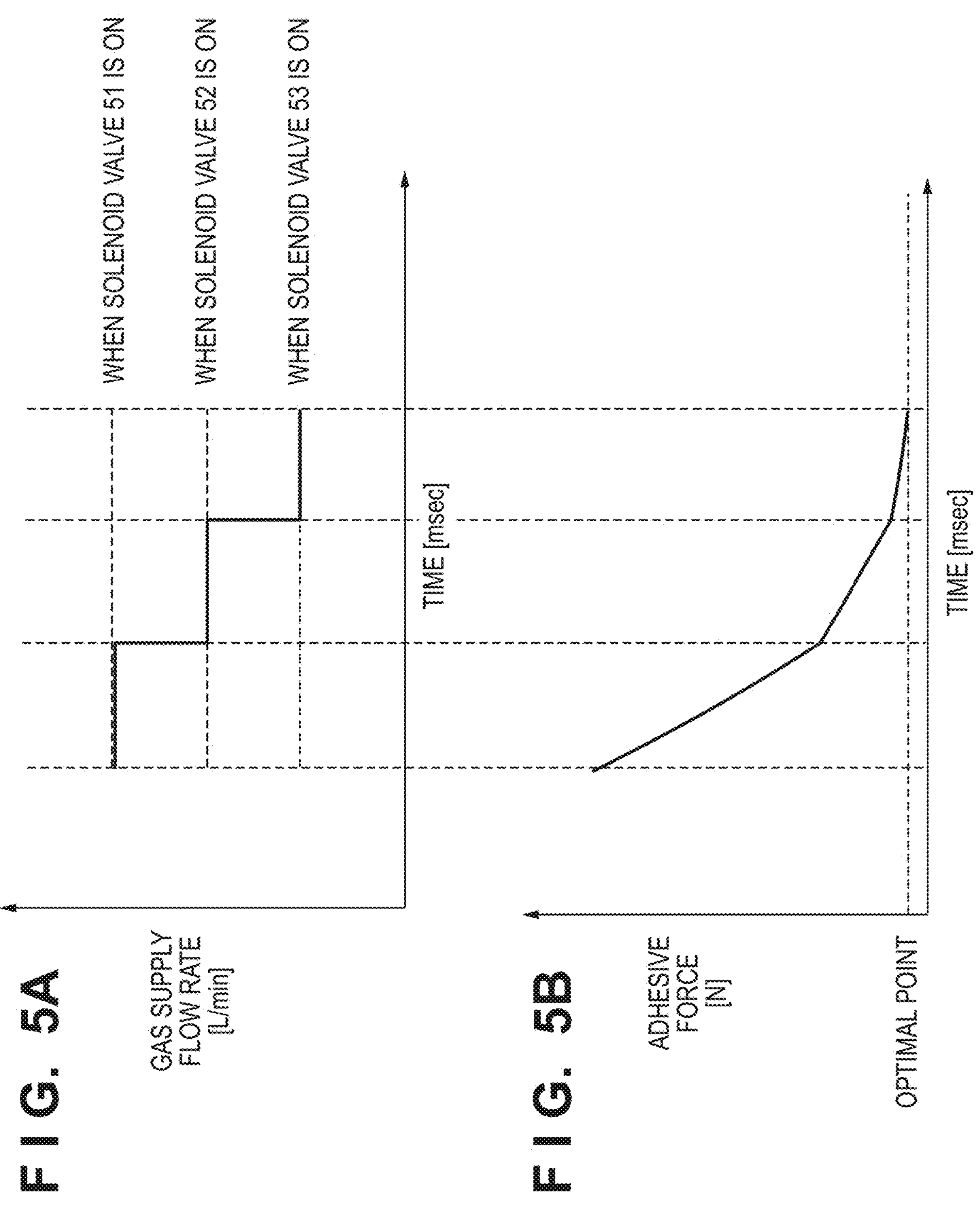
FIGS. 5A and 5B are graphs for explaining the gas supply control.

FIG. 5A shows the gas supply pattern of decreasing the gas supply amount in accordance with the elapse of time from the start of gas supply. The adhesive force acting on a substrate 2 and chuck pins of a substrate chuck 3 decreases as the gas supply time elapses. First, a solenoid valve 51 whose gas supply amount is the largest is turned on. After a predetermined time elapses, the solenoid valve 51 is turned off and a solenoid valve 52 is turned on. With this, the supply amount is changed to the second stage. After the predetermined time further elapses, the solenoid valve 52 is turned off and a solenoid valve 53 is turned on. With this, the supply amount is changed to the third stage. In this manner, by decreasing the gas supply amount as the time elapses, a risk of lateral slide of the substrate 2 can be reduced.

FIG. 5B exemplarily shows the change of the adhesive force between the substrate 2 and the substrate chuck 3 during the gas supply under the gas supply control shown in FIG. 5A. The degree of decrease in the adhesive force changes among the section where the solenoid valve 51 is turned on, the section where the solenoid valve 52 is turned on, and the section where the solenoid valve 53 is turned on.

In this manner, in this embodiment, the supply amount of the gas is changed over time to aim for the adhesive force to reach the optimal point in FIG. 5B. This is because if the adhesive force becomes negative, the substrate 2 slides laterally on the substrate chuck 3.

By decreasing the adhesive force to the optimal point while supplying the gas as described above, a state in which the substrate 2 does not slide laterally on the substrate chuck 3 and the substrate chuck 3 does not wear can be created. The reason why the optimal point is not set to the point where the adhesive force becomes zero is that a small amount of the adhesive force is left to prevent the substrate 2 from sliding laterally.

On the other hand, it is also possible to gradually increase the gas supply flow rate along with the elapse of time. At the beginning of the gas supply, a gas flow path 10 is in a reduced pressure state, so that the supplied gas is instantly and forcefully ejected to the substrate 2. For example, when supplying the gas to a thin substrate, if the gas supply flow rate is increased while the adhesive force is strong, an excessively large force is instantaneously applied to the substrate, and this may cause the substrate to be damaged or warped. In order to reduce such a risk, it is effective to control the gas supply flow rate to be gradually increased.

As in the first embodiment, by obtaining in advance a combination of the adhesive force estimated from the substrate 2 and the substrate chuck 3 and the optimal gas supply parameters corresponding to the adhesive force, it is possible to realize the gas supply corresponding to the respective characteristics. Note that the optimal parameter may be obtained using the adhesive force obtained using the method described in the second or third embodiment, or may be obtained using the adhesive force obtained in a combination of the first, second, and third embodiments.

Fifth Embodiment

Figure 6:
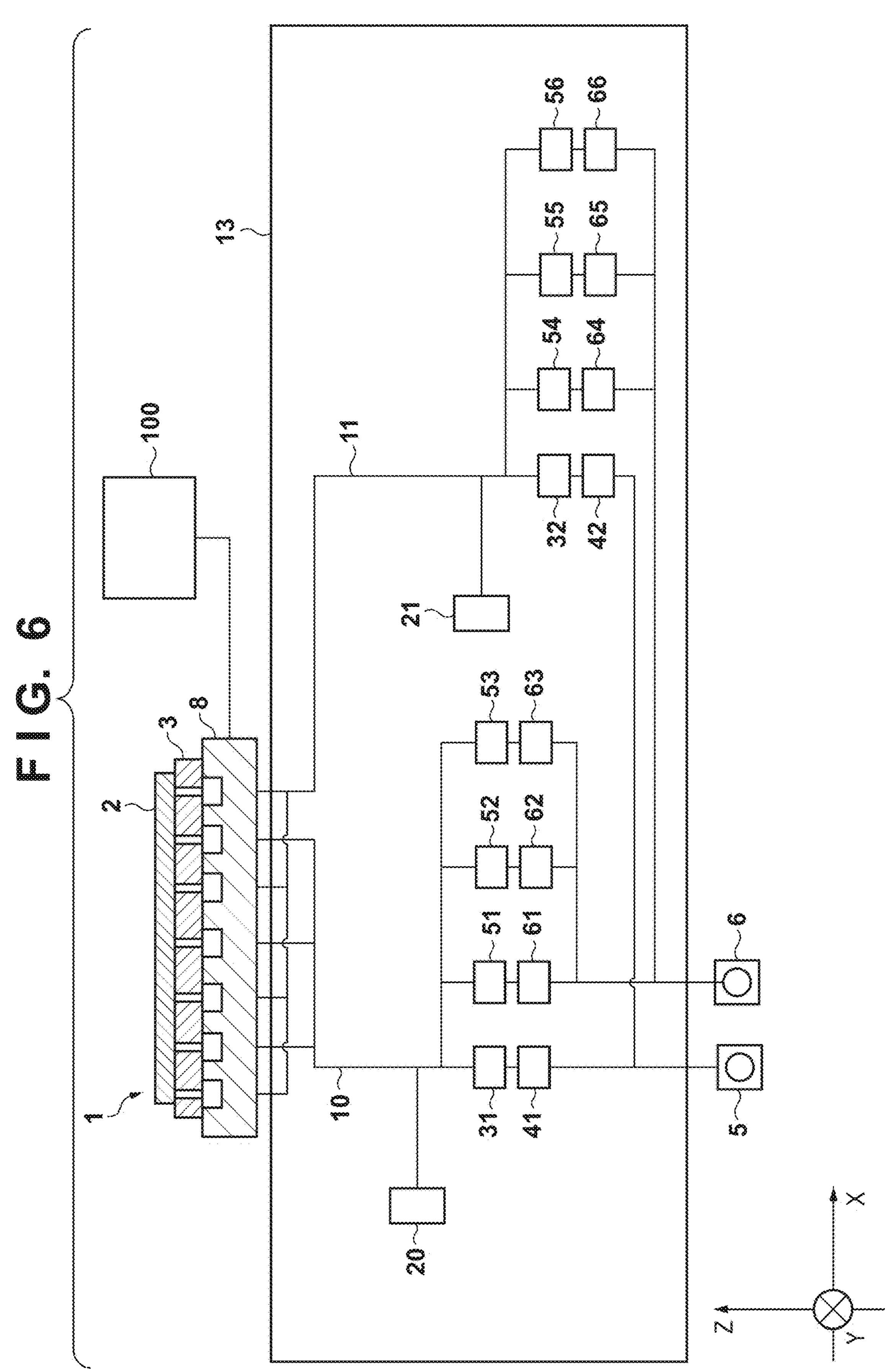
FIG. 6 is a view showing the arrangement of a substrate stage.

With reference to FIG. 6, the arrangement of a substrate stage 1 according to the fifth embodiment will be described. The substrate stage 1 according to the fifth embodiment is different from the substrate stage 1 according to the first embodiment (FIG. 1) in that two systems of gas flow paths are provided. More specifically, in the fifth embodiment, a gas flow path 11 is arranged in addition to a gas flow path 10. Similar to the gas flow path 10, the gas flow path 11 is arranged such that a vacuum pump 5 sucks a gas via openings formed in the surface of a substrate chuck 3 facing a substrate 2 and a gas from a positive pressure tank 6 is supplied via the openings. The pressure in the gas flow path 11 is measured by a pressure sensor 21.

A regulator 42 is arranged on the gas flow path 11 between the vacuum pump 5 and the substrate chuck 3. The regulator 42 is configured to be capable of regulating the pressure in the gas flow path 11 to a desirable vacuum pressure. Further, a solenoid valve 32 is arranged on the gas flow path 11 on the substrate chuck side 3 of the regulator 42. When the solenoid valve 32 is turned on, the vacuum pump 5 regulates the pressure in the space between the substrate 2 and the substrate chuck 3. When the solenoid valve 32 is turned off, the pressure in the space between the substrate 2 and the substrate chuck 3 is not regulated.

Regulators 64, 65, and 66 and solenoid valves 54, 55, and 56 are arranged on the gas flow path 11 between the positive pressure tank 6 and the substrate chuck 3. The regulators 64, 65, and 66 are configured to be capable of regulating the pressure in the gas flow path 11 supplied from the positive pressure tank 6. The solenoid valves 54, 55, and 56 are arranged on the gas flow path 11 on the substrate chuck 3 side of the regulators 64, 65, and 66. When the solenoid valves 54, 55, and 56 are turned on, the positive pressure tank 6 regulates the pressure in the space between the substrate 2 and the substrate chuck 3. When the solenoid valves 54, 55, and 56 are turned off, the pressure in the space between the substrate 2 and the substrate chuck 3 is not regulated. Note that FIG. 6 shows three sets of regulators and solenoid valves on the gas flow path 11, but the number of sets is not limited to a specific number. The number of sets may be one, or four or more. Instead of the combination of the solenoid valve and the regulator, a servo valve whose opening/closing degree can be freely set may be formed.

When holding the substrate 2 by the substrate chuck 3 by vacuum suction, a solenoid valve 31 and the solenoid valve 32 are turned on and solenoid valves 51, 52, and 53 and the solenoid valves 54, 55, and 56 are turned off. With this, the vacuum pump 5 can reduce the pressure in the space between the substrate 2 and the substrate chuck 3. Since it is sufficient that the pressure in the space between the substrate 2 and the substrate chuck 3 can be reduced, one of the solenoid valve 31 and the solenoid valve 32 may be turned on.

When releasing the substrate 2 from the substrate chuck 3, the solenoid valves 31 and 32 are turned off, at least one of the solenoid valves 51, 52, and 53 is turned on, and at least one of the solenoid valves 54, 55, and 56 is turned on.

With this, the pressure in the space between the substrate 2 and the substrate chuck 3 can be increased with the gas from the positive pressure tank 6.

Similar to the first embodiment, by changing the settings of the regulators 61, 62, 63, 64, 65, and 66, it is possible to change the solenoid valve to be turned on among the solenoid valves 51, 52, and 53, and change the solenoid valve to be turned on among the solenoid valves 54, 55, and 56. With this, it is possible to change the flow rate and pressure of the gas which fills the space between the substrate 2 and the substrate chuck 3.

Figure 7:
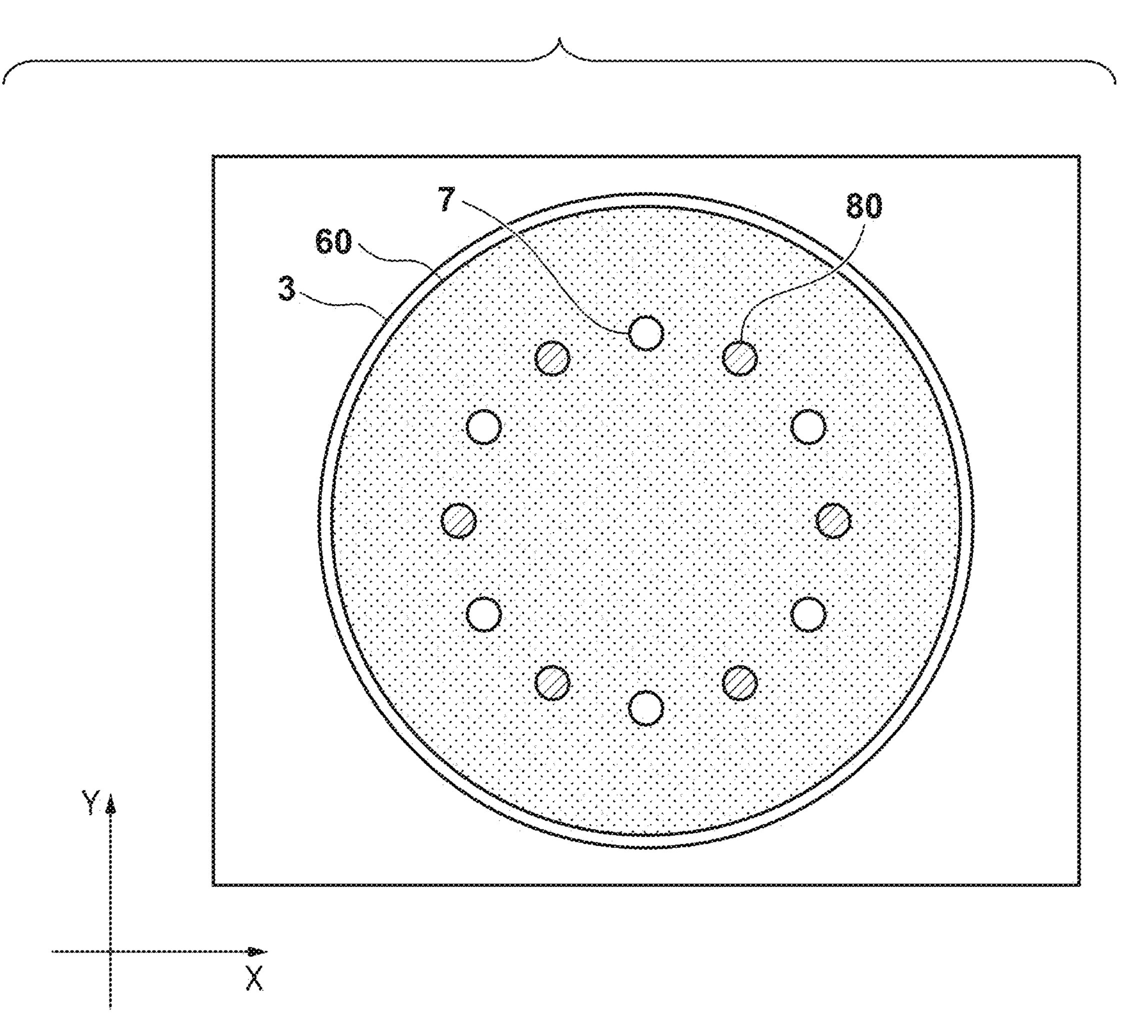
FIG. 7 is a plan view of a substrate chuck.

FIG. 7 is a plan view of the substrate chuck 3 in this embodiment when viewed from the +Z direction. An annular seal portion 60 is provided at a position along the outer periphery of the substrate chuck 3. However, the presence/absence, number, and arrangement of the seal portions 60 are not limited to the example shown in FIG. 7. For example, the substrate chuck 3 may be provided with no seal portion. Alternatively, a plurality of seal portions may be provided.

The surface of the substrate chuck 3 is provided with a plurality of protrusions (not shown), and the upper surfaces of the plurality of protrusions can serve as the holding surface for holding the substrate 2. The plurality of protrusions are referred to as chuck pins. The substrate chuck 3 includes openings 7 connected to the gas flow path 10. The substrate chuck 3 also includes openings 80 connected to the gas flow path 11. FIG. 7 shows six openings 7 and six openings 80, but the arrangement and number thereof are not limited to the example shown in FIG. 7. In this manner, the plurality of openings can be formed in the surface of the substrate chuck 3 facing the substrate 2. A controller 100 can independently control the supply amount of a gas from the first opening among the plurality of openings and the supply amount of a gas from the second opening among the plurality of openings. Alternatively, the plurality of openings may include an opening used for gas supply and an opening not used for gas supply.

As compared to the first embodiment, the two systems of gas flow paths are advantageous in that the gas supply amount can be finely set. It is also possible to change the balance between the supply amount of the gas supplied from the gas flow path 10 and the supply amount of the gas supplied from the gas flow path 11 in accordance with the wear condition of the chuck. By changing the balance of gas supply amounts, the adhesive force between the substrate 2 and the substrate chuck 3 after the gas supply can be changed, thereby preventing local wear of the substrate chuck 3.

Next, a gas supply method will be described. In the first embodiment, the gas supply flow rate is controlled by turning on one of the solenoid valves 51, 52, and 53, and the gas supply time is controlled by the time between the turn-on and turn-off of the solenoid valve. In this embodiment, the gas can be supplied by turning on at least one of the solenoid valves 51, 52, 53, 54, 55, and 56. By separating the systems, the flow rate of the gas supplied to the space between the substrate 2 and the substrate chuck 3 can be finely set.

The number of the positive pressure tank 6 is not limited to one. For example, the positive pressure tank may be formed for each of the gas flow path 10 and the gas flow path 11. In this case, since the gas supply amount can be increased, it is possible to implement optimal gas supply even for a substrate with a large adhesive force.

The supply flow rate and supply amount of the gas supplied to the space between the substrate 2 and the substrate chuck 3 from the gas flow path 10 and the supply flow rate and supply amount of the gas supplied to the space between the substrate 2 and the substrate chuck 3 from the gas flow path 11 may be set separately.

Sixth Embodiment

In the sixth embodiment, an example will be described in which a plurality of openings for supplying a gas are provided, as compared to the fifth embodiment. In the sixth embodiment, the gas supply is changed in accordance with the elapse of time. In the sixth embodiment, the gas can be supplied by turning on at least one of solenoid valves 51, 52, 53, 54, 55, and 56. Then, in accordance with the elapse of time, the solenoid valve to be turned on is switched. With this, the supply flow rate of the gas supplied to the space between a substrate 2 and a substrate chuck 3 can be finely set.

Various embodiments have been described above. In any embodiment, the relationship between the original 203 and the original chuck formed on the original stage 204 is similar to the relationship between the substrate 2 and the substrate chuck 3. Therefore, any of the first to sixth embodiments can be applied to the gas supply control for releasing the original 203 from the original chuck.

Seventh Embodiment

In the above embodiments, it has been described that the gas supply is controlled based on the information concerning the adhesive force of the substrate to the holding surface (the information concerning the easiness of separation), which is obtained in advance. It is also possible to control the gas supply without the information concerning the adhesive force of the substrate (the information concerning the easiness of separation). As has been described above, it is assumed that a job of the exposure process job is input on a lot basis and the characteristics of the substrate change for each lot. Therefore, a controller 100 may set, for each lot, the contents of the gas supply control via a gas flow path 10 for releasing holding of a substrate 2 by a substrate chuck 3. Alternatively, the controller 100 may set, not for each lot but for each substrate, the contents of the gas supply control via the gas flow path 10 for releasing holding of the substrate 2 by the substrate chuck 3.

Embodiment of Article Manufacturing Method

Figure 16:
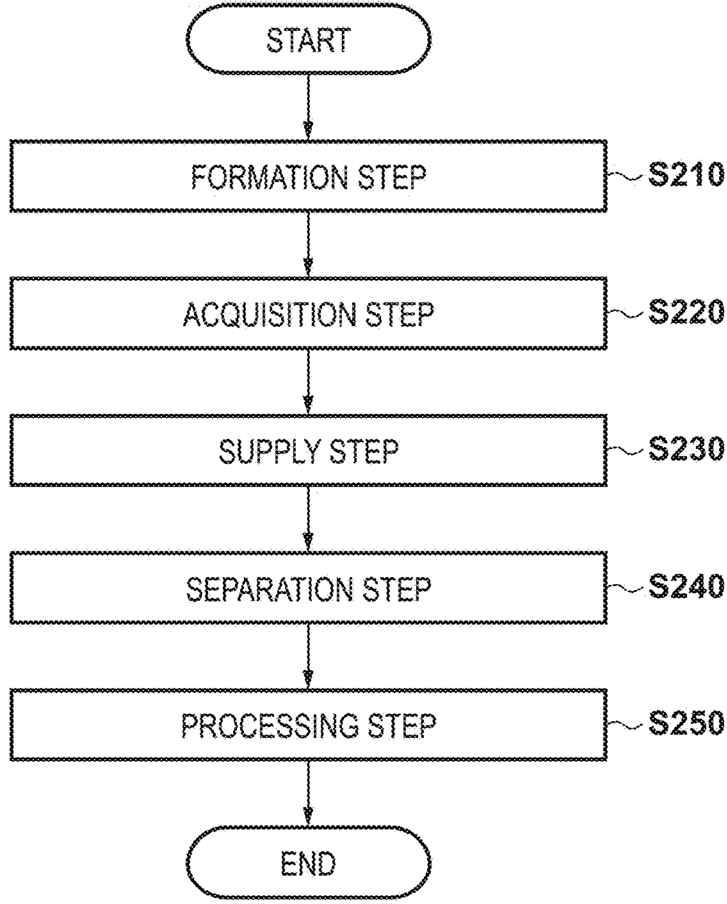
FIG. 16 is a flowchart of an article manufacturing method.

An article manufacturing method according to the embodiment of the present invention is suitable for manufacturing an article, for example, a microdevice such as a semiconductor device or an element having a microstructure. FIG. 16 is a flowchart of the article manufacturing method according to this embodiment.

First, a formation step (step S210) of forming a pattern on a substrate 2 is performed. Next, an acquisition step (step S220) of acquiring information concerning the adhesive force between the substrate 2 and a substrate chuck 3 is performed. Next, a supply step (step S230) of supplying a gas between the substrate 2 and the substrate chuck 3 based on the information concerning the adhesive force acquired in the acquisition step is performed. Next, after supply of the gas is started in the supply step, a separation step (step S240) of separating the substrate 2 from the substrate chuck 3 is performed. Then, a processing step (step S250) of processing the substrate 2 separated in the separation step is performed.

The processing step can include other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-151544, filed Sep. 19, 2023, and Japanese Patent Application No. 2024-090286, filed Jun. 3, 2024, which are hereby incorporated by reference herein in their entirety.

What is claimed is:

1. A substrate holding apparatus comprising:
a holder configured to hold a substrate by applying a holding force to the substrate;
a gas supplier configured to supply a gas between the substrate and the holder; and
a controller configured to control the gas supplier,
wherein an adhesive force between the substrate and the holder decreases over time as the gas is supplied by the gas supplier, the adhesive force being a residual adhesive force remaining after the holder stops application of the holding force holding the substrate, and
wherein in a case of separating the substrate from the holder, the controller is configured to control a supply amount of the gas to be reduced based on information concerning the residual adhesive force between the substrate and the holder.

2. The apparatus according to claim 1, wherein the controller is configured to further control the gas supplier based on at least one of a characteristic of the substrate and a characteristic of the holder.

3. The apparatus according to claim 2, wherein the characteristic of the substrate includes at least one of an amount of warpage of the substrate, a roughness of a surface of the substrate which comes into contact with the holder, the type of a film formed on the substrate, a material of the substrate, and a thickness of the substrate.

4. The apparatus according to claim 2, wherein the characteristic of the holder includes at least one of a flatness of a holding surface holding the substrate, a surface roughness of the holding surface, thicknesses of a plurality of convex portions provided on the holder, and a material of the holder.

5. The apparatus according to claim 1, wherein
the gas supplier includes a pipe configured to allow the gas to flow therethrough, and
the pipe is also used to decompress a space between the substrate and the holder to hold the substrate by the holder.

6. The apparatus according to claim 1,
wherein the controller is configured to further control a supply time of the gas.

7. The apparatus according to claim 1, wherein
a plurality of openings are formed in a surface of the holder facing the substrate, and
the controller is configured to separately control a supply amount of a gas from a first opening among the plurality of openings and a supply amount of a gas from a second opening among the plurality of openings.

8. The apparatus according to claim 7, wherein the plurality of openings include an opening used for gas supply and an opening not used for gas supply.

9. The apparatus according to claim 1, further comprising:
a driving mechanism configured to drive the holder in a first direction orthogonal to the holding surface of the holder which holds the substrate; and
a measurement unit configured to measure a position of the holder in the first direction,
wherein the information concerning the residual adhesive force is obtained based on a difference between a target position of the holder in the first direction and a position of the holder in the first direction which is measured by the measurement unit.

10. The apparatus according to claim 1, further comprising:
a pipe provided in the gas supplier for allowing the gas to flow therethrough; and
a pressure sensor configured to measure a pressure in the pipe,
wherein the information concerning the residual adhesive force is obtained based on a pressure measured by the pressure sensor.

11. The apparatus according to claim 1,
wherein the controller is configured to set contents of control of supply of the gas for each lot.

12. A substrate processing apparatus comprising:
a holder configured to hold a substrate by applying a holding force to the substrate; and
a gas supplier configured to supply a gas between the substrate and the holder; and
a controller configured to control the gas supplier,
wherein an adhesive force between the substrate and the holder decreases over time as the gas is supplied by the gas supplier, the adhesive force being a residual adhesive force remaining after the holder stops application of the holding force holding the substrate, and
wherein in a case of separating the substrate from the holder, the controller is configured to control a supply amount of the gas to be reduced based on information concerning the residual adhesive force between the substrate and the holder.

13. The apparatus according to claim 12, wherein the controller is configured to further control a supply time of the gas.

14. The apparatus according to claim 12, wherein the apparatus is a lithography apparatus configured to form a pattern on a substrate.

15. A separation method of separating a substrate from a holder holding the substrate by applying a holding force to the substrate, comprising:
acquiring information concerning an adhesive force between the substrate and the holder;
supplying a gas between the substrate and the holder based on the information concerning the adhesive force acquired in the acquiring; and
separating the substrate from the holder after supply of the gas is started in the supplying,
wherein the adhesive force is a force that decreases over time as the gas is supplied, the adhesive force being a residual adhesive force remaining after the holder stops application of the holding force holding the substrate, and
wherein in the supplying, a supply amount of the gas is reduced based on information concerning the residual adhesive force.

16. An article manufacturing method comprising:

forming a pattern on a substrate held by a holder applying a holding force to the substrate;

acquiring information concerning an adhesive force between the substrate and the holder;

supplying, based on the information concerning the adhesive force acquired in the acquiring, a gas between the holder and the substrate with the pattern formed thereon in the forming;

separating the substrate from the holder after supply of the gas is started in the supplying;

processing the substrate separated in the separating; and manufacturing an article using the substrate processed in the processing, wherein the adhesive force is a force that decreases over time as the gas is supplied, the adhesive force being a residual adhesive force remaining after the holder stops application of the holding force holding the substrate, and wherein in the supplying, a supply amount of the gas is reduced based on information concerning the residual adhesive force.

* * * * *